(12) United States Patent
Liaw

(10) Patent No.: US 11,158,632 B1
(45) Date of Patent: Oct. 26, 2021

(54) FIN-BASED STRAP CELL STRUCTURE FOR IMPROVING MEMORY PERFORMANCE

(71) Applicant: Taiwan Semiconductor Manufacturing Co., Ltd., Hsin-Chu (TW)

(72) Inventor: Jhon Jhy Liaw, Hsinchu County (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 16/837,973

(22) Filed: Apr. 1, 2020

(51) Int. Cl.
| | | |
|---|---|---|
| H01L 27/092 | (2006.01) |
| H01L 27/088 | (2006.01) |
| H01L 27/11 | (2006.01) |
| H01L 21/8234 | (2006.01) |
| H01L 21/8239 | (2006.01) |
| H01L 29/78 | (2006.01) |
| H01L 29/66 | (2006.01) |
| H01L 21/8238 | (2006.01) |

(52) U.S. Cl.
CPC ...... *H01L 27/0886* (2013.01); *H01L 21/8239* (2013.01); *H01L 21/823431* (2013.01); *H01L 21/823821* (2013.01); *H01L 27/0924* (2013.01); *H01L 27/0928* (2013.01); *H01L 27/1104* (2013.01); *H01L 29/6681* (2013.01); *H01L 29/785* (2013.01); *H01L 2029/7858* (2013.01)

(58) Field of Classification Search
CPC ..... H01L 21/823431; H01L 21/823821; H01L 21/8239; H01L 27/0886; H01L 27/0924; H01L 27/0928; H01L 27/1104; H01L 29/66545; H01L 29/66795; H01L 29/6681; H01L 29/66818; H01L 29/785; H01L 29/7851; H01L 2029/7858
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |

(Continued)

*Primary Examiner* — Stephen W Smoot
(74) *Attorney, Agent, or Firm* — Haynes and Boone, LLP

(57) ABSTRACT

A device includes a memory cell having a gate-all-around (GAA) transistor and the well strap cell having a dummy fin-like field effect transistor (FinFET). The GAA transistor includes a first fin extending along a first direction, and the dummy FinFET includes a second fin extending along the first direction. The GAA transistor includes first source/drain features over the first fin and suspended channel layers between the first source/drain features. The first source/drain features include a first type dopant. The suspended channel layers have a first channel width along a second direction different than the first direction. The dummy FinFET includes second source/drain features over the second fin and a fin channel layer between the second source/drain features. The second source/drain features include a second type dopant. The fin channel layer has a second channel width along the second direction. The second channel width is greater than the first channel width.

20 Claims, 22 Drawing Sheets

(56) References Cited

U.S. PATENT DOCUMENTS

| | | | |
|---|---|---|---|
| 9,236,300 B2 | 1/2016 | Liaw | |
| 9,490,335 B1* | 11/2016 | Doris | H01L 27/0928 |
| 9,520,482 B1 | 12/2016 | Chang et al. | |
| 9,576,814 B2 | 2/2017 | Wu et al. | |
| 10,157,987 B1* | 12/2018 | Liaw | H01L 29/7848 |
| 10,170,484 B1* | 1/2019 | Sung | H01L 29/0673 |
| 10,297,667 B1* | 5/2019 | Yeung | H01L 29/0665 |
| 10,332,881 B1* | 6/2019 | Badaroglu | H01L 27/0207 |
| 10,950,609 B2* | 3/2021 | Yang | H01L 27/1108 |
| 2020/0098879 A1* | 3/2020 | Lee | H01L 21/0262 |
| 2020/0135729 A1* | 4/2020 | Ng | H01L 29/42392 |
| 2021/0074841 A1* | 3/2021 | Lin | H01L 29/785 |

\* cited by examiner

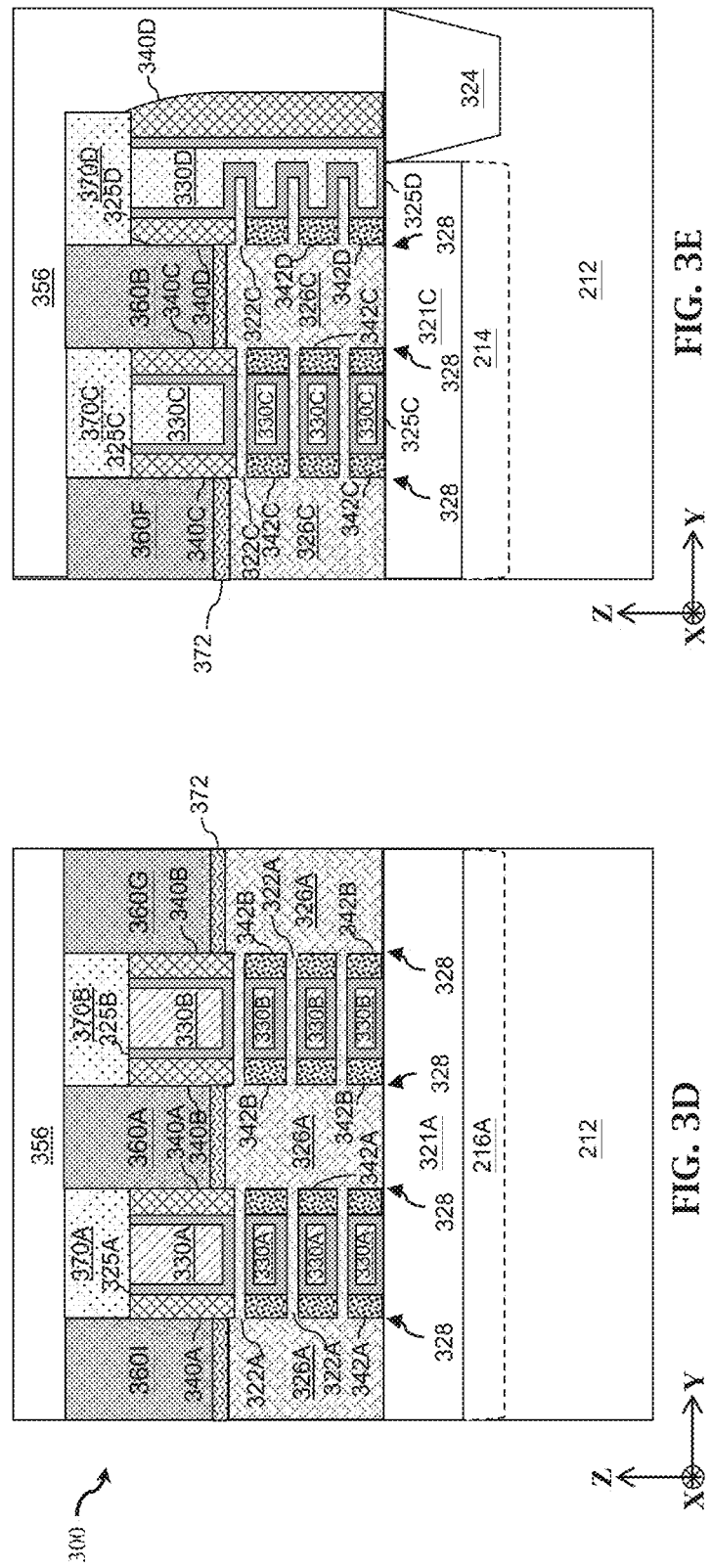

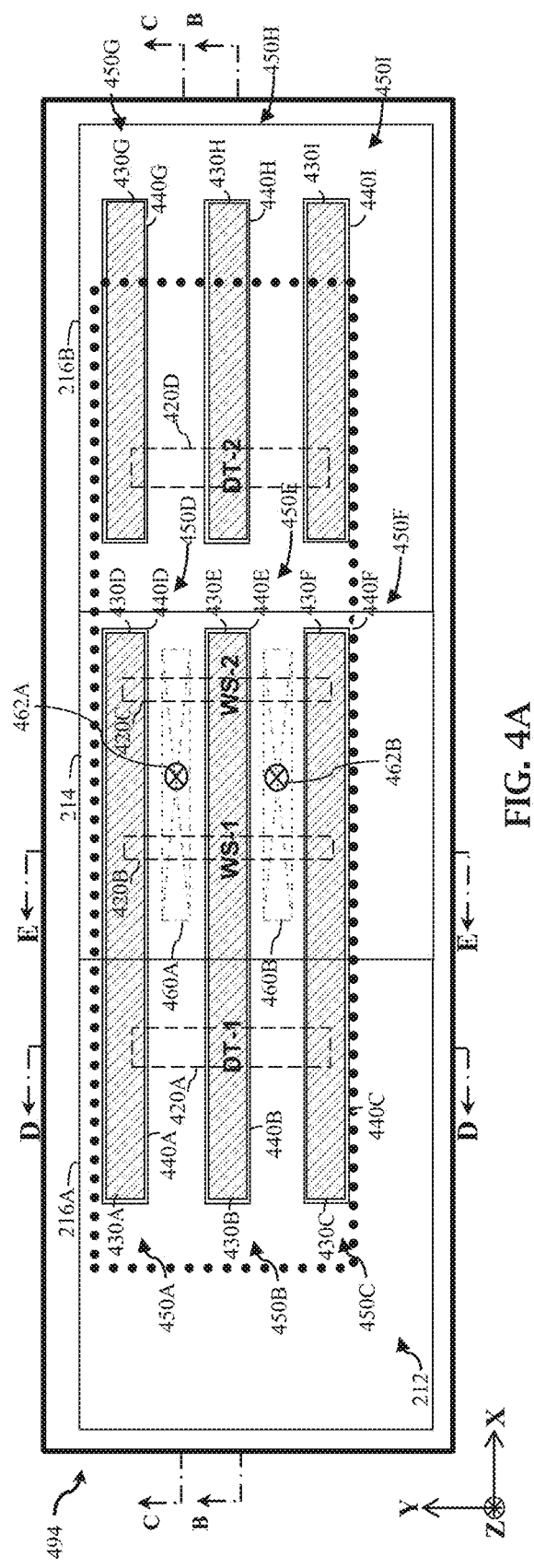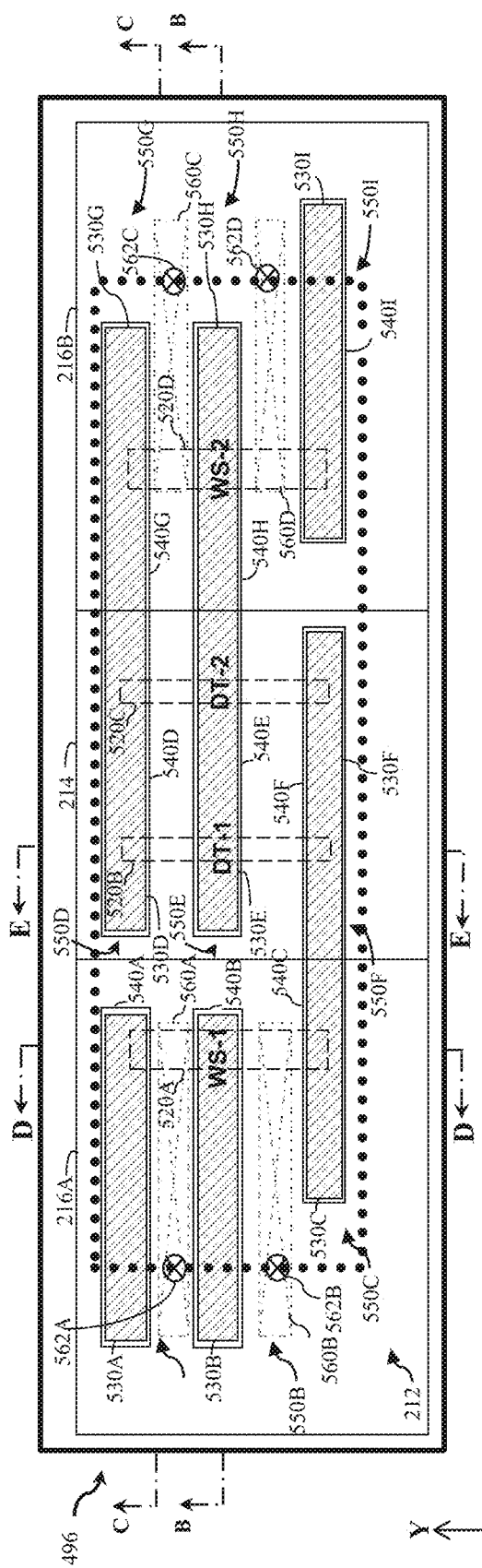
FIG. 4A
FIG. 5A

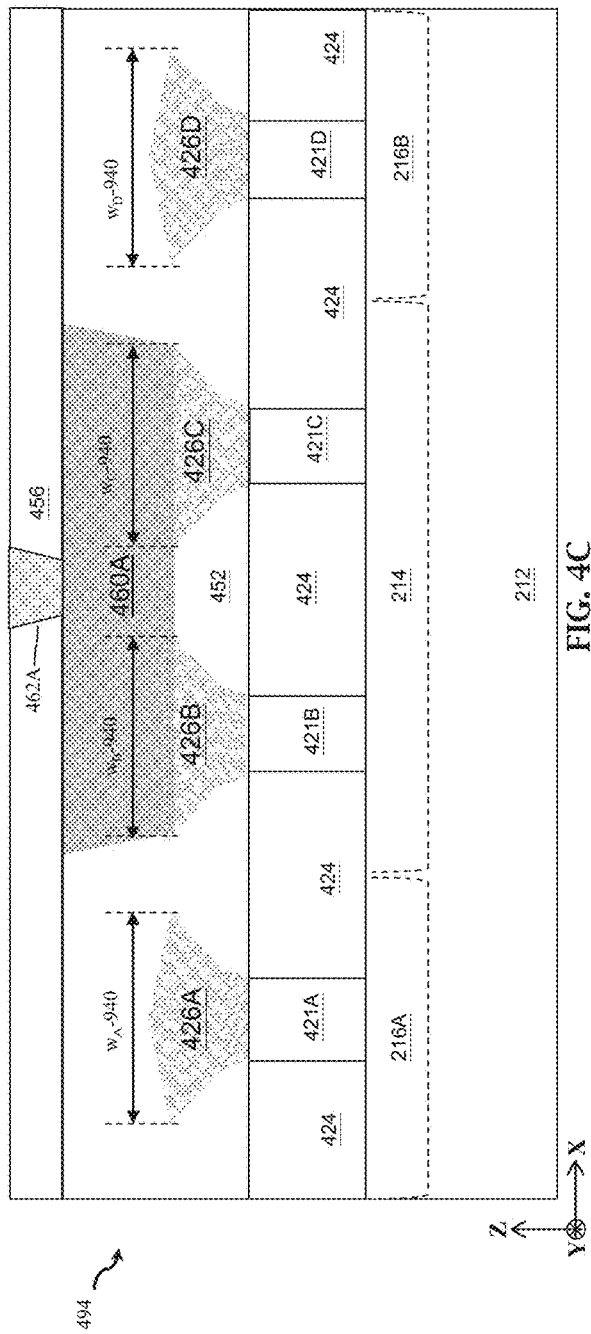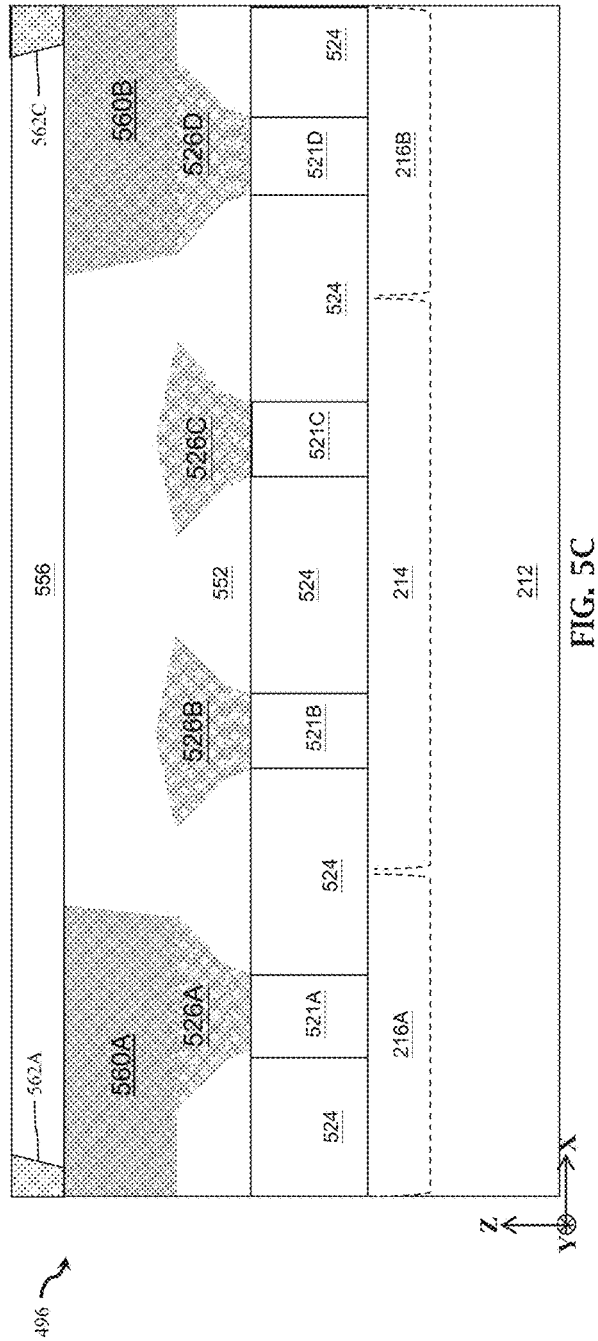

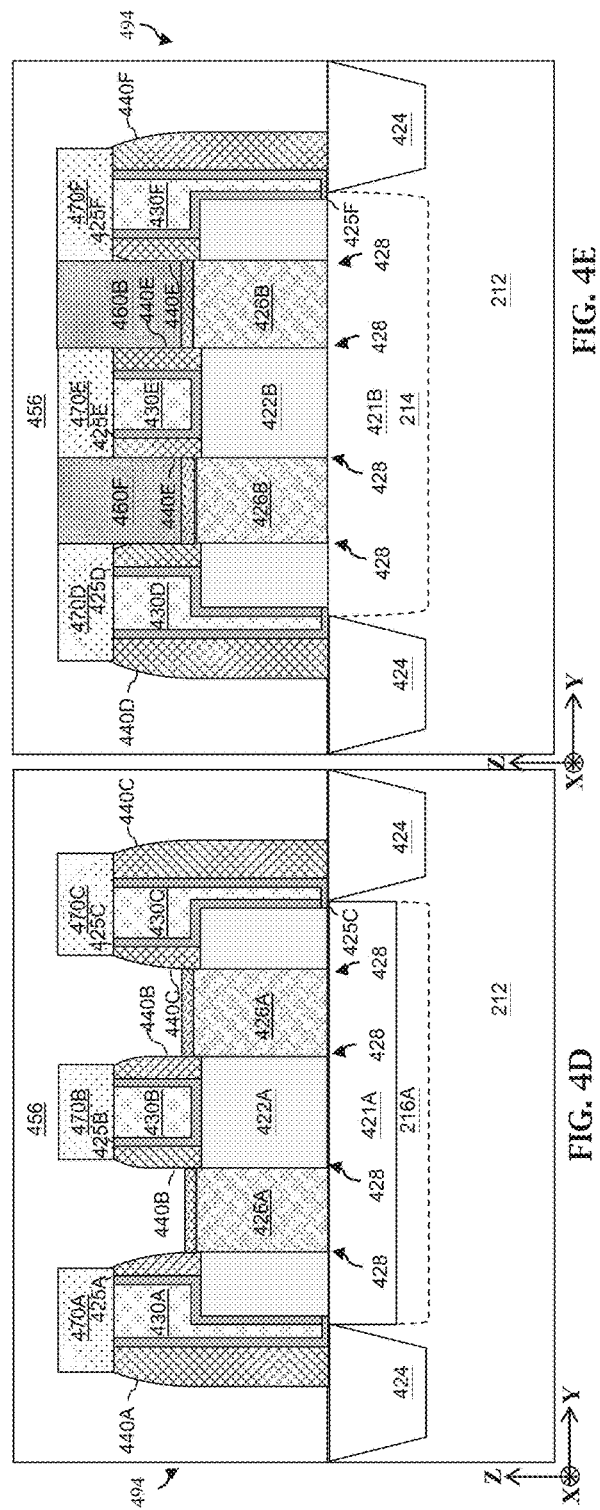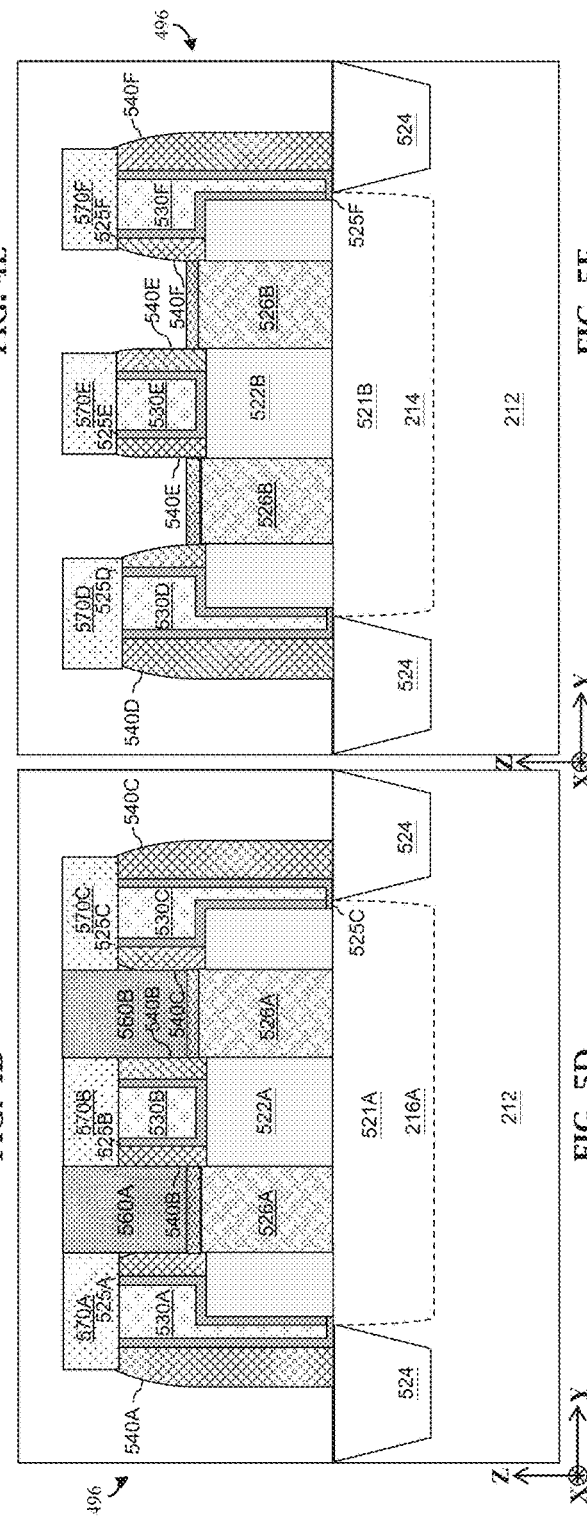

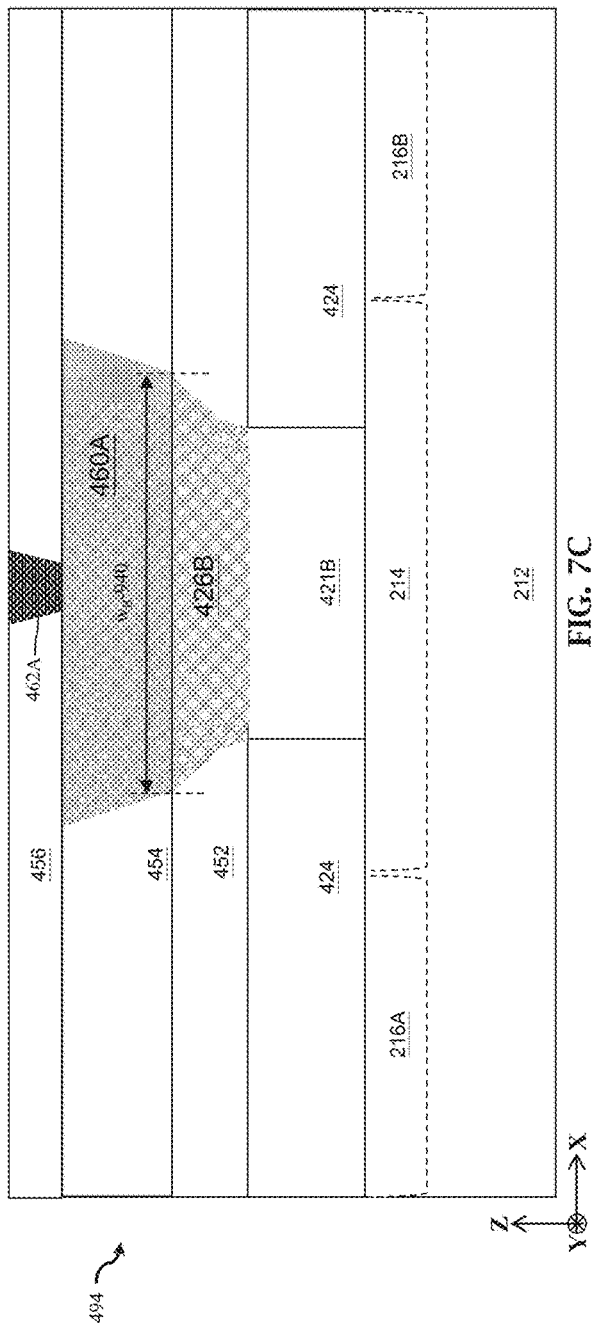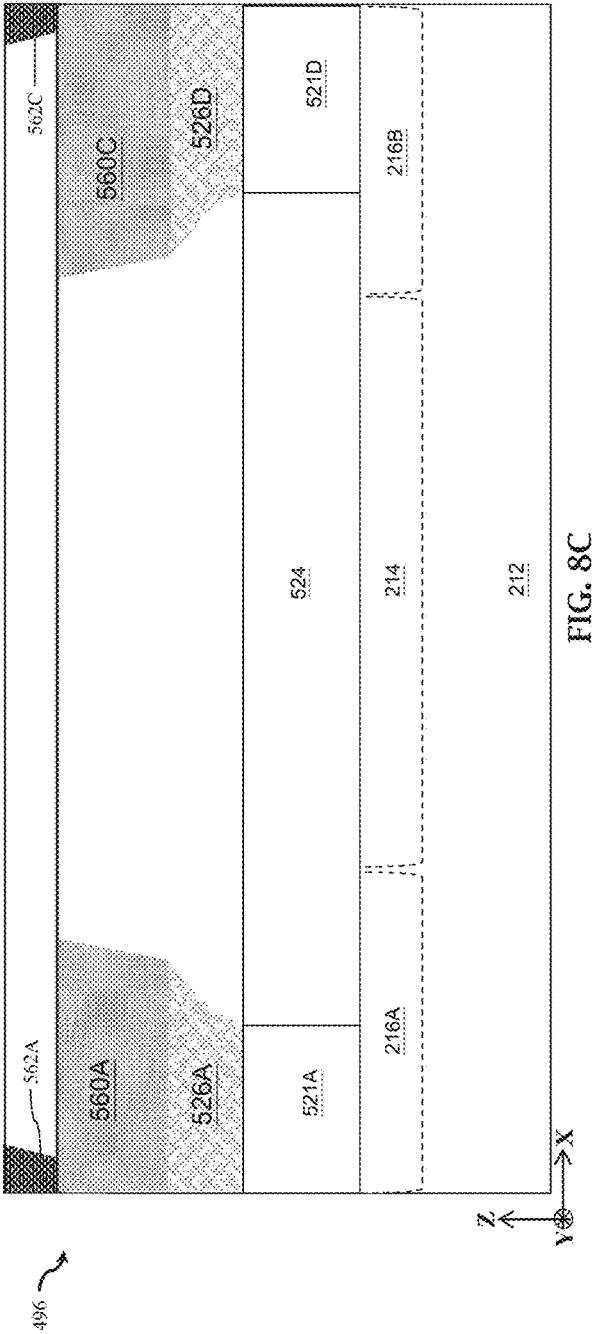

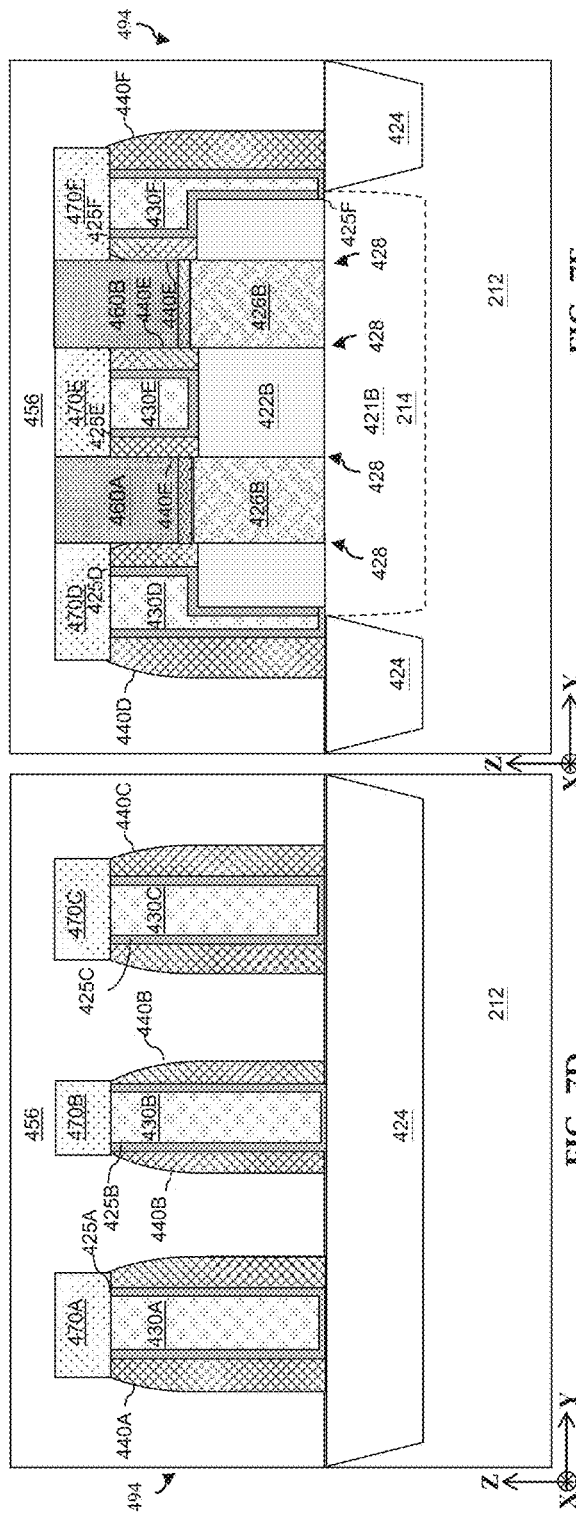
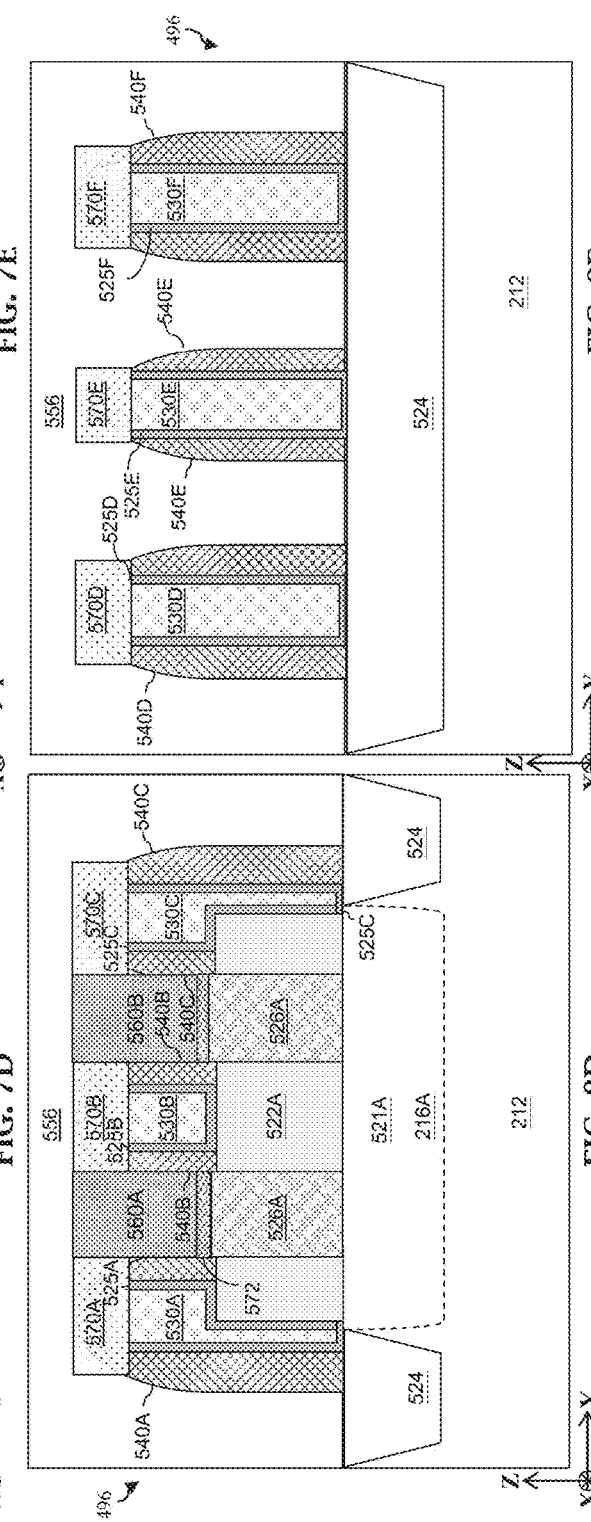

FIN-BASED STRAP CELL STRUCTURE FOR IMPROVING MEMORY PERFORMANCE

BACKGROUND

Static random access memory (SRAM) generally refers to any memory or storage that can retain stored data only when power is applied. Since SRAM cell performance is largely layout dependent (for example, it has been observed that an inner SRAM cell of a SRAM array will perform differently than an edge SRAM cell of the SRAM array), well strap cells have been implemented to stabilize well potential to facilitate uniform charge distribution throughout a SRAM array, thereby facilitating uniform performance among SRAM cells of the SRAM array. As integrated circuit (IC) technologies progress towards smaller technology nodes, SRAMs often incorporate fin-based structures, such as fin-like field effect transistors (FinFETs) and/or gate-all-around (GAA) transistors, into SRAM cells to enhance performance. However, as fin dimensions shrink, fin-based well strap cells have been observed to increase pick-up resistance and/or reduce latch-up performance of SRAM arrays. Accordingly, although existing SRAM arrays have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-3E are fragmentary diagrammatic views of a portion of the memory region of FIG. 2, illustrating an SRAM cell, according to various aspects of the present disclosure.

FIGS. 4A-4E are fragmentary diagrammatic views of a portion of the memory region of FIG. 2, illustrating an n-type well strap portion of a well strap cell, according to various aspects of the present disclosure.

FIGS. 5A-5E are fragmentary diagrammatic views of a portion of the memory region of FIG. 2, illustrating a p-type well strap portion of a well strap cell, according to various aspects of the present disclosure.

FIGS. 7A-7E are fragmentary diagrammatic views of a portion of the memory region of FIG. 6, illustrating an n-type well strap portion of a well strap cell, according to various aspects of the present disclosure.

FIGS. 8A-8E are fragmentary diagrammatic views of a portion of the memory region of FIG. 6, illustrating a p-type well strap portion of a well strap cell, according to various aspects of the present disclosure.

DETAILED DESCRIPTION

Figure 1A:
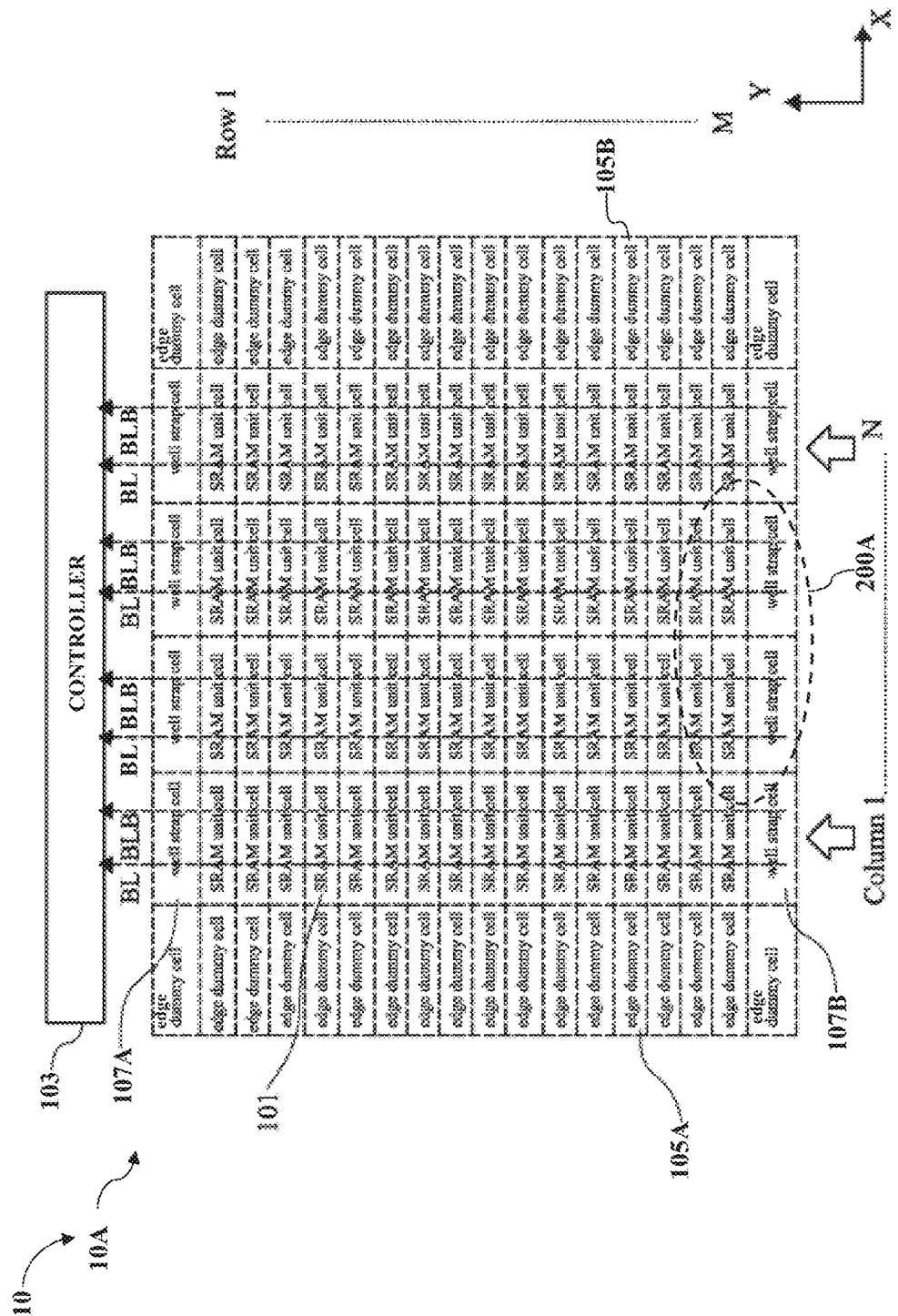
FIGS. 1A-1C are diagrammatic plan views of a memory chip, in portion or entirety, according to various aspects of the present disclosure.

The present disclosure relates generally to integrated circuit (IC) devices, and more particularly, to fin-based strap cell structures for IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Memory devices, such as static random access memory (SRAM) devices, include multiple memory cells, often arranged in arrays, where each memory cell stores a bit of data. The performance of the memory cells is layout dependent. For example, it has been observed that an inner memory cell of a memory array will perform differently than an edge memory cell of the memory array. In some implementations, inner memory cells and edge memory cells exhibit different threshold voltages ($V_t$), different on-currents ($I_{on}$), and/or different off-currents ($I_{off}$). Accordingly, well straps have been implemented to stabilize well potential and to facilitate uniform charge distribution throughout a memory array, thereby facilitating uniform performance among memory cells of the memory array. A well strap (also referred to as an electrical tie) electrically connects a well region corresponding with a transistor of a memory cell to a voltage node (or voltage line). For example, an n-type well strap electrically connects an n-well region corresponding with a p-type transistor to a voltage node, such as a voltage node associated with the p-type transistor, and a p-type well strap electrically connects a p-well region corresponding with an n-type transistor to a voltage node, such as a voltage node associated with the n-type transistor. Well straps (and well strap cells) do not store data, thus are often referred to as non-functional transistors (and non-functional memory cells).

As the technology nodes continue to shrink, fin-like field effect transistors (FinFETs), and more recently, gate-all-around (GAA) transistors (also referred to as multi-bridge-channel MOSFETs), have been incorporated into memory cells for enhanced performances because of their reduced footprint on the memory chips. It is often the target to scale down the pitches and widths of the fins (or base fins) of these transistors in order to achieve higher functional densities. However, scaling down for well straps have been observed to diminish their benefits. For example, decreasing fin widths of well straps have been observed to increase well pickup resistance, such that a well pickup resistance of a narrower fin-based well strap is higher than a well pickup resistance of a wider fin-based well strap, which is in turn much higher than a well pick up resistance of a planar-based (or non-fin-based) well strap. Such increases in well pickup resistance have been observed to degrade latch-up performance of memory arrays and adversely affect the overall performances.

The present disclosure thus proposes modifications to memory device structures that can achieve improvements in performance. For example, as described herein, GAA transistors with small pitches and small widths are adopted for the functional memory cells, while FinFETs with large fin widths are adopted as well straps for the non-functional well strap cells. This configuration has been observed to significantly reduce well pickup resistance associated with the fin-based well strap without affecting the functional density of the memory cells or their desired characteristics (for example, voltage threshold). Moreover, this configuration does not require significant modifications to the existing fabrication techniques because, for example, some of the fabrication steps used for the well straps described herein may be integrated with the fabrication steps of input/output (I/O) devices on the same memory device. It has further been observed that reducing the well pick up resistance as described herein improves latch-up immunity of a memory array. Because the well straps with large fin widths, like planar-based well straps, have lower pick up resistance relative to well straps with small fin widths, they are also referred to herein as planar-like well straps. Different embodiments may have different advantages, and no particular advantage is necessarily required of any embodiment.

Figure 1B:
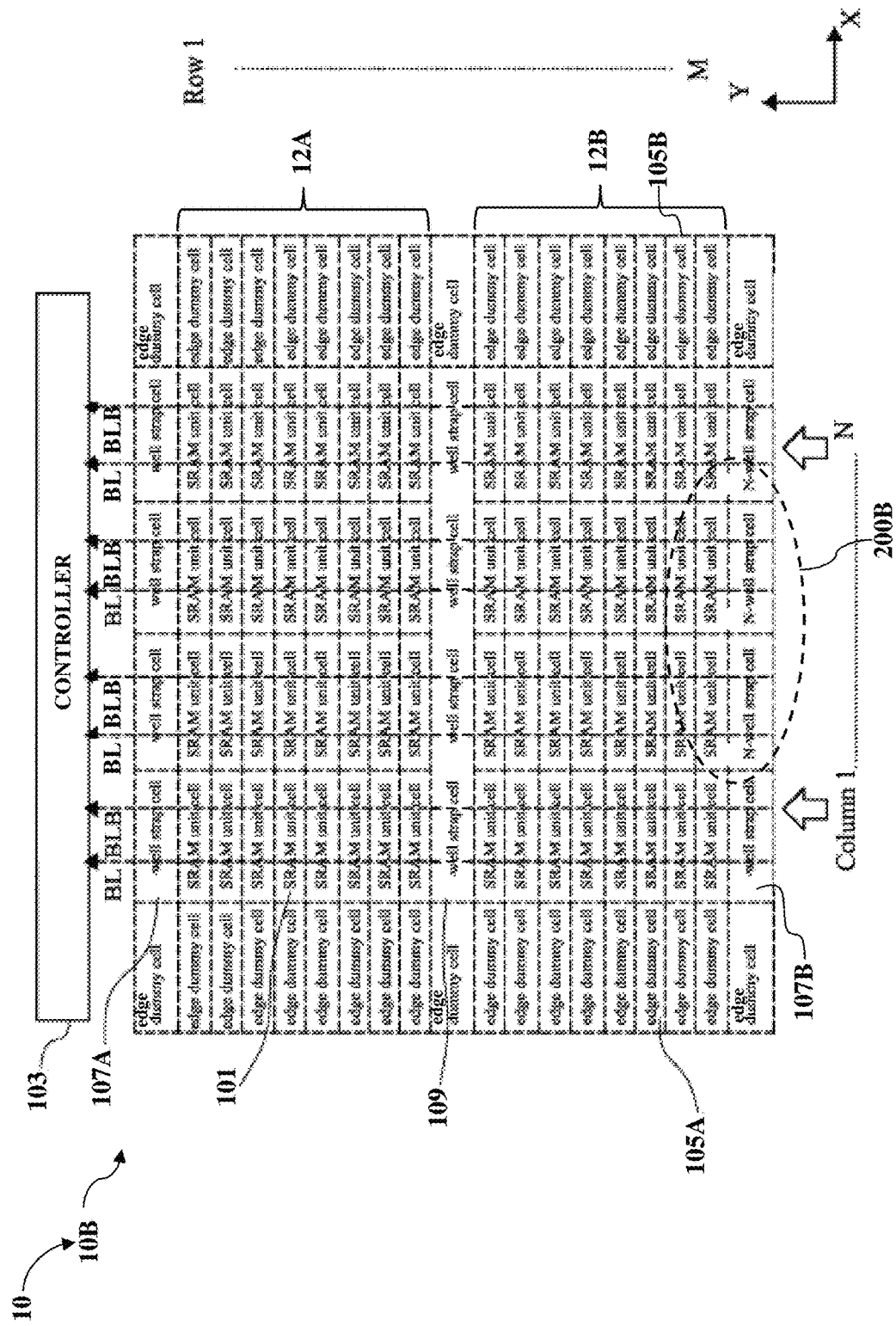
Figure 1C:
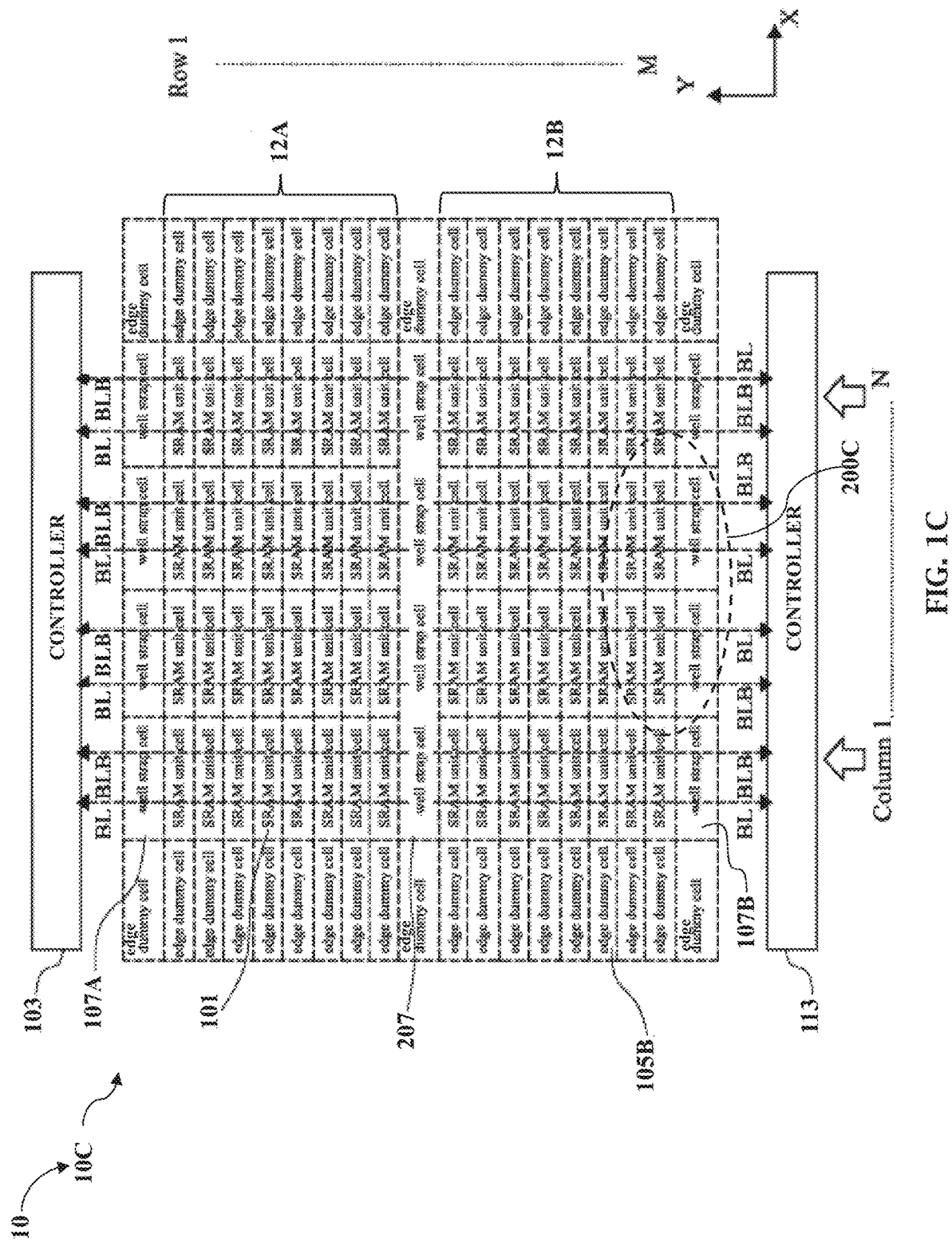

FIGS. 1A-1C are diagrammatic plan views of a memory chip 10, in portion or entirety, according to various aspects of the present disclosure. In the depicted embodiment, memory chip 10 includes SRAM cells, thus is also referred to as SRAM chip 10. However, the present disclosure contemplates embodiments, where memory chip 10 includes another type of memory, such as a dynamic random access memory (DRAM), a non-volatile random access memory (NVRAM), a flash memory, or other suitable memory. Memory chip 10 may be included in a microprocessor, a memory, and/or other IC device. In some implementations, memory chip 10 may be a portion of an IC chip, an SoC, or portion thereof, that includes various passive and active microelectronic devices such as resistors, capacitors, inductors, diodes, PFETs, NFETs, MOSFETs, GAA transistors, CMOS transistors, BJTs, LDMOS transistors, high voltage transistors, high frequency transistors, other suitable components, or combinations thereof. FIGS. 1A-1C have been simplified for the sake of clarity to better understand the inventive concepts of the present disclosure. Additional features can be added in memory chip 10, and some of the features described below can be replaced, modified, or eliminated in other embodiments of memory chip 10.

Referring to FIG. 1A, in some embodiments, the memory chip 10 includes a memory array 10A. Memory array 10A includes memory cells 101, such as SRAM memory cells, configured to store data. In some implementations, memory cells 101 include various p-type transistors and/or n-type transistors. Memory cells 101 are arranged in column 1 to column N extending along a first direction (here, in a y-direction) and row 1 to row M extending along a second direction (here, in an x-direction), where N and M are positive integers. Column 1 to column N each include a bit line pair extending along the first direction, such as a bit line (BL) and a bit line bar (BLB) (also referred to as a complementary bit line), that facilitate reading data from and/or writing data to respective memory cells 101 in true form and complementary form on a column-by-column basis. Row 1 to row M each includes a word line (WL) (not shown) that facilitates access to respective memory cells 101 on a row-by-row basis. Each memory cell 101 is electrically connected to a respective BL, a respective BLB, and a respective WL, which are electrically connected to a controller 103. Controller 103 is configured to generate one or more signals to select at least one WL and at least one bit line pair (here, BL and BLB) to access at least one of memory cells 101 for read operations and/or write operations. Controller 103 includes any circuitry suitable to facilitate read/write operations from/to memory cells 101, including but not limited to, a column decoder circuit, a row decoder circuit, a column selection circuit, a row selection circuit, a read/write circuit (for example, configured to read data from and/or write data to memory cells 101 corresponding to a selected bit line pair (in other words, a selected column)), other suitable circuit, or combinations thereof. In some implementations, the controller 103 includes at least one sense amplifier configured to detect and/or amplify a voltage differential of a selected bit line pair. In some implementations, the sense amplifier is configured to latch or otherwise store data values of the voltage differential.

A perimeter of memory array 10A is configured with dummy cells, such as edge dummy cells and well strap cells, to ensure uniformity in performance of memory cells 101. Dummy cells are configured physically and/or structurally similar to memory cells 101, but do not store data. For example, dummy cells can include p-type wells, n-type wells, fin structures (including one or more fins), gate structures, source features and drain features (generally and collectively referred to as source/drain features), and/or contact features. Well strap cells generally refer to dummy cells that are configured to electrically couple a voltage to an n-type well of memory cells 101, a p-type well of memory cells 101, or both. In the depicted embodiment, row 1 to row M each begin with an edge dummy cell 105A and end with an edge dummy cell 105B, such that row 1 to row M of memory cells 101 are disposed between edge dummy cells 105A and edge dummy cells 105B. Edge dummy cells 105A and edge dummy cells 105B are arranged in respective columns extending along the first direction (here, the y-direction). In some implementations, the column of edge dummy cells 105A and/or the column of edge dummy cells 105B are substantially parallel to at least one bit line pair (here, BL and BLB) of memory array 100. In some implementations, edge dummy cells 105A and/or edge dummy cells 105B are configured to connect respective memory cells 101 to respective WLs. In some implementations, edge dummy cells 105A and/or edge dummy cells 105B include circuitry for driving WLs. In some implementations, edge dummy cells 105A and/or edge dummy cells 105B are electrically connected to a power supply voltage $V_{DD}$ (for example, a positive power supply voltage) and/or a power supply voltage $V_{SS}$ (for example, an electrical ground).

In furtherance of the depicted embodiment, column 1 to column N each begin with a well strap cell 107A and end with a well strap cell 107B, such that column 1 to column N of memory cells 101 are disposed between well strap cells 107A and well strap cells 107B. Well strap cells 107A and well strap cells 107B are arranged in respective rows extending along the second direction (here, the x-direction). In some implementations, the row of well strap cells 107A and the row of well strap cells 107B are substantially parallel to at least one WL of memory array 100. Well strap cells 107A are disposed between one of edge dummy cells 105A and one of edge dummy cells 105B, and well strap cells 107B are disposed between one of edge dummy cells 105A and one of edge dummy cells 105B. In the depicted embodiment, well strap cells 107A and/or well strap cells 107B include an n-type well strap, a p-type well strap, or both an n-type well strap and a p-type well strap. In some implementations, well strap cells 107A and/or well strap cells 107B include an n-type well strap portion having one or more n-type well straps disposed adjacent to a p-type well strap portion having one or more p-type well straps. The n-type well strap portion and the p-type well strap portion may be disposed between dummy regions of the well strap cells 107A and/or the well strap cells 107B. In some implementations, an n-type well strap of well strap cells 107A and/or well strap cells 107B is configured to electrically couple an n-type well that corresponds with at least one p-type functional transistor of memory cells 101 to a voltage source (for example, $V_{DD}$). In some implementations, a p-type well strap of well strap cells 107A and/or well strap cells 107B is configured to electrically couple a p-type well that corresponds with at least one n-type functional transistor of memory cells 101 to a voltage source (for example, $V_{SS}$). Memory array 10A includes a memory region 200A, which is described in more detail below.

Referring to FIG. 1B, in some embodiments, the memory chip 10 includes a memory array 10B. Memory array 10B is similar in many respects to memory array 10A. Accordingly, similar features in FIG. 1B and FIG. 1A are identified by the same reference numerals for clarity and simplicity. For example, memory array 10B includes memory cells 101, controller 103, edge dummy cells 105A, edge dummy cells 105B, well strap cells 107A, and well strap cells 107B. In contrast to memory array 10A, memory array 10B divides memory cells 101 into a memory array 12A and a memory array 12B (which can be referred to as sub-arrays). Further, the bit line pair spans memory array 12A and memory array 12B continuously, such that each memory cell 101 of memory array 12A and each memory cell 101 of memory array 12B is electrically connected to a respective BL, a respective BLB, and a respective WL, which are electrically connected to controller 103. Memory array 10B further includes a row of well strap cells 109 extending along the second direction (here, the x-direction), where the row of well strap cells 109 is disposed between memory array 12A and memory array 12B. Memory cells 101 in memory array 12A are disposed between well strap cells 107A and well strap cells 109, and memory cells 101 in memory array 12B are disposed between well strap cells 109 and well strap cells 107B. Column 1 to column N of memory cells 101 in memory array 12A thus each begin with one of well strap cells 107A and end with one of well strap cells 109, and column 1 to column N of memory cells 101 in memory array 12B thus each begin with one of well strap cells 109 and end with one of well strap cells 107B. In furtherance of the depicted embodiment, the row of well strap cells 109 is also disposed between one of edge dummy cells 105A and one of edge dummy cells 105B. In some implementations, the row of well strap cells 109 is substantially parallel to at least one WL of memory array 10B. Well strap cells 109 are similar to well strap cells 107A and/or well strap cells 107B. For example, well strap cells 109 include an n-type well strap, a p-type well strap, or both an n-type well strap and a p-type well strap. In some implementations, well strap cells 109 include an n-type well strap portion having one or more n-type well straps that is adjacent to a p-type well strap portion having one or more p-type well straps. The n-type well strap portion and the p-type well strap portion may be disposed between dummy regions. In some implementations, an n-type well strap of well strap cells 109 is configured to electrically couple an n-type well that corresponds with at least one p-type functional transistor of memory cells 101 to a voltage source (for example, $V_{DD}$). In some implementations, a p-type well strap of well strap cells 109 is configured to electrically couple a p-type well that corresponds with at least one n-type functional transistor of memory cells 101 to a voltage source (for example, $V_{SS}$). Memory array 10B includes a memory region 200B, which is described in more detail below.

Referring to FIG. 1C, in some embodiments, the memory chip 10 includes a memory array 10C. Memory array 10C is similar in many respects to memory array 10B. Accordingly, similar features in FIG. 1C and FIG. 1B are identified by the same reference numerals for clarity and simplicity. For example, memory array 10C includes memory cells 101, controller 103, edge dummy cells 105A, edge dummy cells 105B, well strap cells 107A, well strap cells 107B, and well strap cells 109. In contrast to memory array 10B, memory array 10C breaks each bit line pair into a bit line pair for memory array 12A and a bit line pair for memory array 12B, such that column 1 to column N each have two bit line pairs, not a continuous bit line pair. Memory array 10C further includes a controller 113, where BLs, BLBs, and WLs for memory array 12A are electrically connected to controller 103, while BLs, BLBs, and WLs for memory array 12B are electrically connected to controller 113. Controller 113 is similar to controller 103. Accordingly, each memory cell 101 of memory array 12A is electrically connected to a respective BL, a respective BLB, and a respective WL, which are electrically connected to controller 103, and each memory cell 101 in memory array 12B is electrically connected to a respective BL, a respective BLB, and a respective WL, which are electrically connected to controller 113. Memory array 10C includes a memory region 200C, which is described in more detail below.

Figure 2:
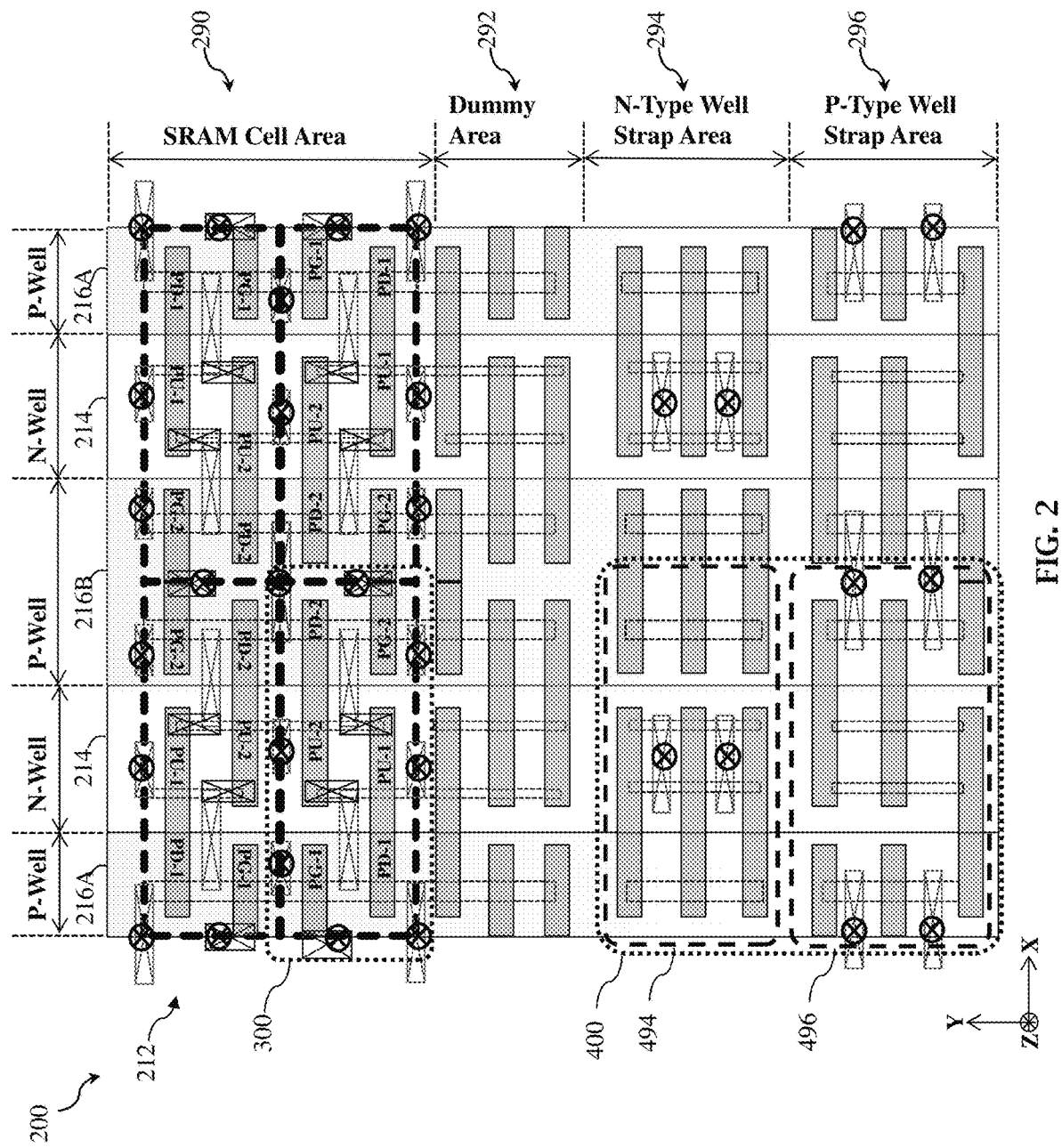
FIG. 2 is a diagrammatic plan view of a memory region, in portion or entirety, which can be implemented in a memory chip, according to various aspects of the present disclosure.

As described above, memory array 10A includes a memory region 200A, memory array 10B includes a memory region 200B, and memory array 10C includes a memory region 200C. The memory regions 200A, 200B, and 200C are similar to each other and collectively referred to as a memory region 200. FIG. 2 is a diagrammatic plan view of memory region 200 (for example, in an x-y plane), in portion or entirety, according to various aspects of the present disclosure. FIG. 2 has been simplified for the sake of clarity to better understand the inventive concepts of the present disclosure. Additional features can be added in the memory region 200, and some of the features described below can be replaced, modified, or eliminated in other embodiments of the memory region 200.

The memory region 200 includes a substrate (wafer) 212. In the depicted embodiment, substrate 212 includes silicon. Alternatively or additionally, substrate 212 includes another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as SiGe, SiPC, GaAsP, AlInAs, AlGaAs, GaInAs, GaInP, and/or GaInAsP; or combinations thereof. Alternatively, substrate 212 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

Substrate 212 includes various doped regions configured according to design requirements of the memory region 200. In the depicted embodiment, substrate 212 includes n-type doped regions 214 (also referred to as n-wells) and p-type doped regions 216A and 216B (also referred to as p-wells). N-type doped regions 214 are configured for p-type metal-oxide-semiconductor (PMOS) transistors, such as pull-up (PU) transistors; and p-type doped regions 216A and 216B (collectively, p-type doped region 216) are configured for n-type MOS (NMOS) transistors, such as pull-down (PD) transistors and pass-gate (PG) transistors. N-type doped regions, such as n-type doped regions 214, are doped with n-type dopants, such as phosphorus (e.g. $P^{31}$), arsenic (As), other n-type dopant, or combinations thereof. P-type doped regions, such as p-type doped regions 216A and 216B, are doped with p-type dopants, such as boron (for example, $B^{11}$ and/or $BF_2$), indium, other p-type dopant, or combinations thereof. In some implementations, substrate 212 includes doped regions formed with a combination of p-type dopants and n-type dopants. The various doped regions can be formed directly on and/or in substrate 212, for example, providing a p-well structure, an n-well structure, a dual-well structure, a raised structure, or combinations thereof. An ion implantation process, a diffusion process, and/or other suitable doping process can be performed to form the various doped regions.

The memory region 200 may include a SRAM cell area 290, a dummy area 292, an n-type well strap area 294, and a p-type well strap area 296. In the depicted embodiment, the dummy area 292 is disposed between the SRAM cell area 290 and the well strap area (including the n-type well strap area 294 and the p-type well strap area 296), and the n-type well strap area 294 is disposed between the dummy area 292 and the p-type well strap area 296. However, the present disclosure contemplates different arrangements of the SRAM cell area 290, the dummy area 292, the n-type well strap area 294, and the p-type well strap area 296 depending on design requirements. SRAM cell area 292 includes a plurality of SRAM cells 300, each of which can correspond respectively with one of memory cells 101 in FIGS. 1A-1C; the n-type well strap area 294 includes a plurality of n-type well portions (such as n-type well strap portions 494); and the p-type well strap area 296 includes a plurality of p-type well straps (such as p-type well strap portions 496). The n-type well strap portion 494 and the p-type well strap portion 496 collectively form a well strap cell 400, which can correspond with one of well strap cells 107B in FIGS. 1A-1C. Accordingly, the well strap cell 400 spans across the n-type well strap area 294 and the p-type well strap area 296 and includes n-type well strap portion 494 and p-type well strap portion 496. These various features are formed on the substrate 212 (and in the n-type doped regions 214 and/or the p-type doped regions 216A and 216B) and are described in more detail below.

Figure 3A:
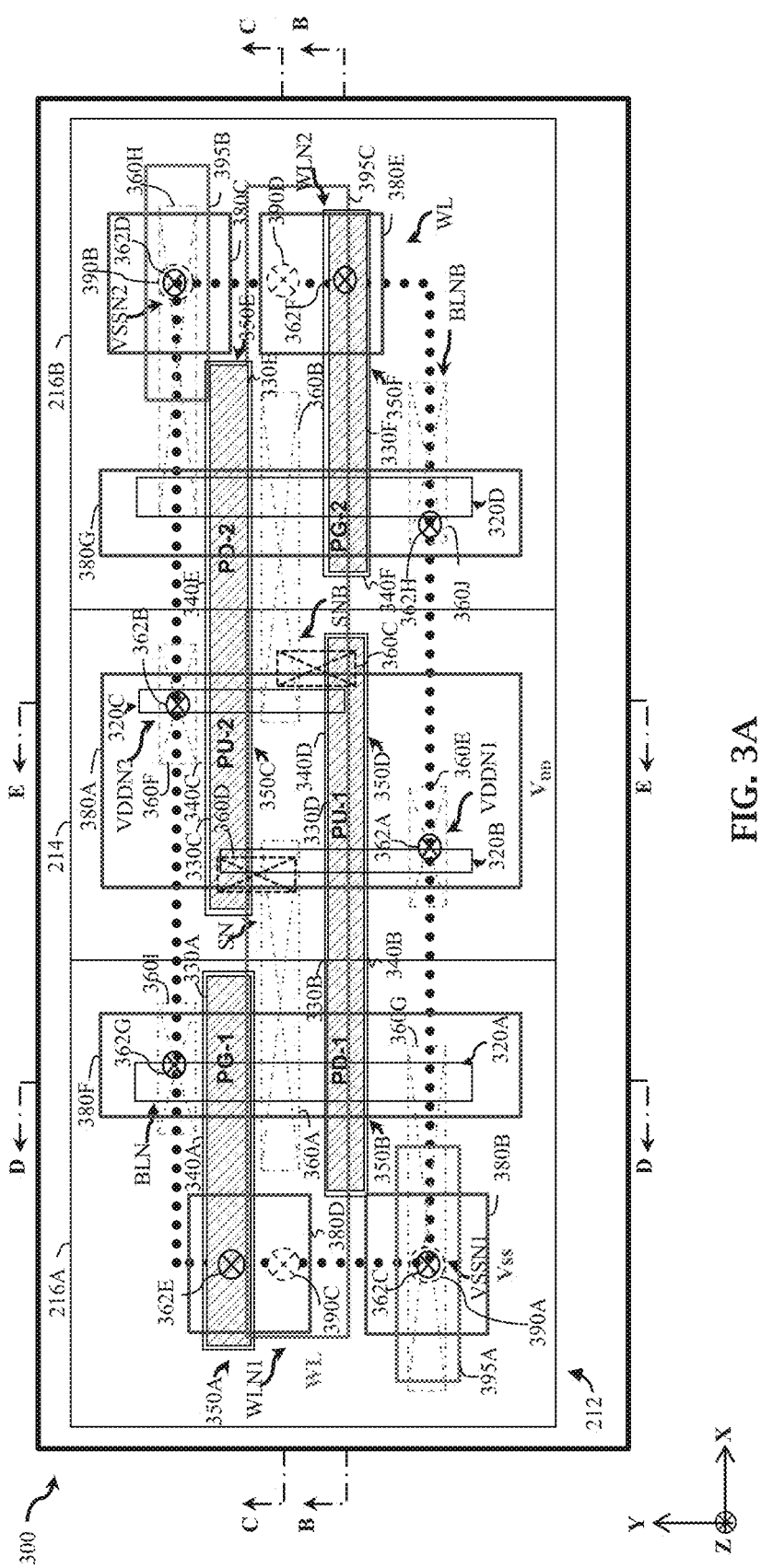
Figure 3B:
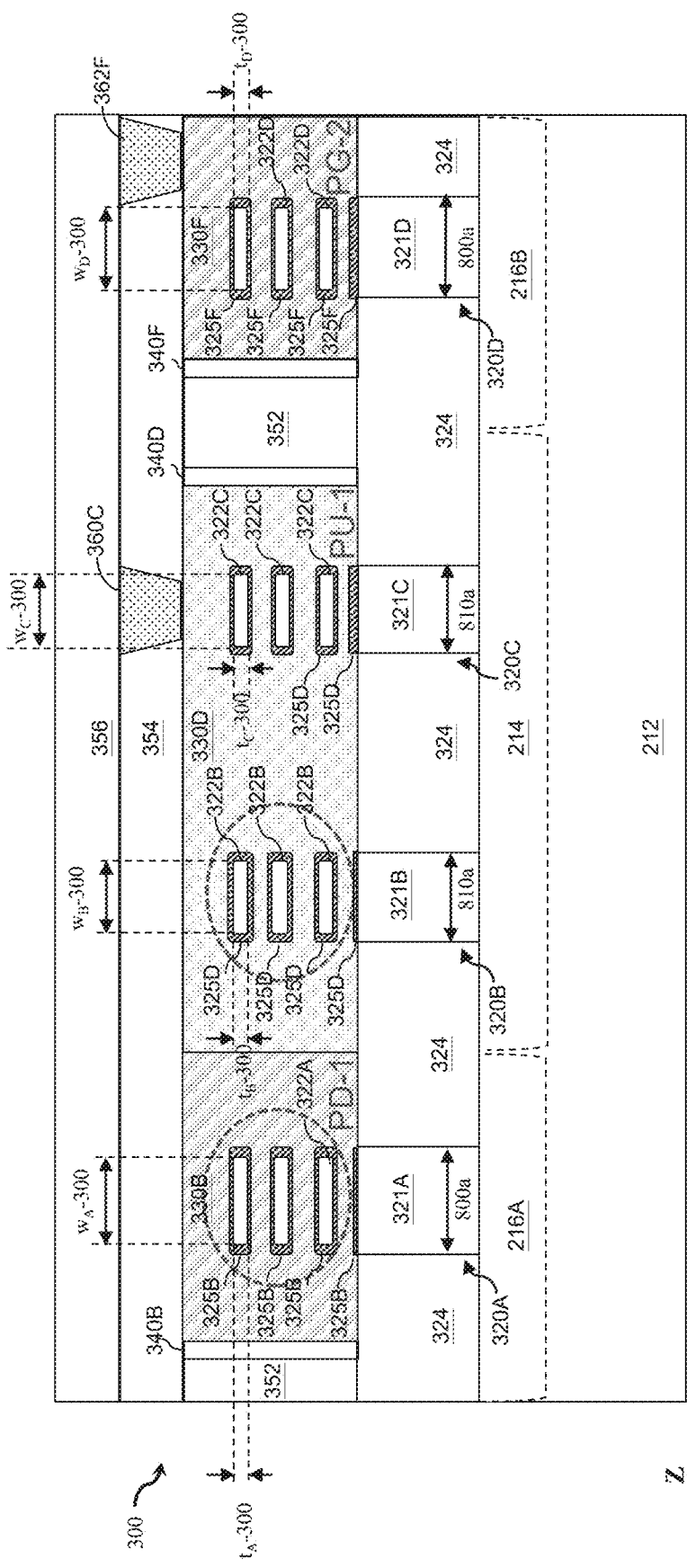
Figure 3C:
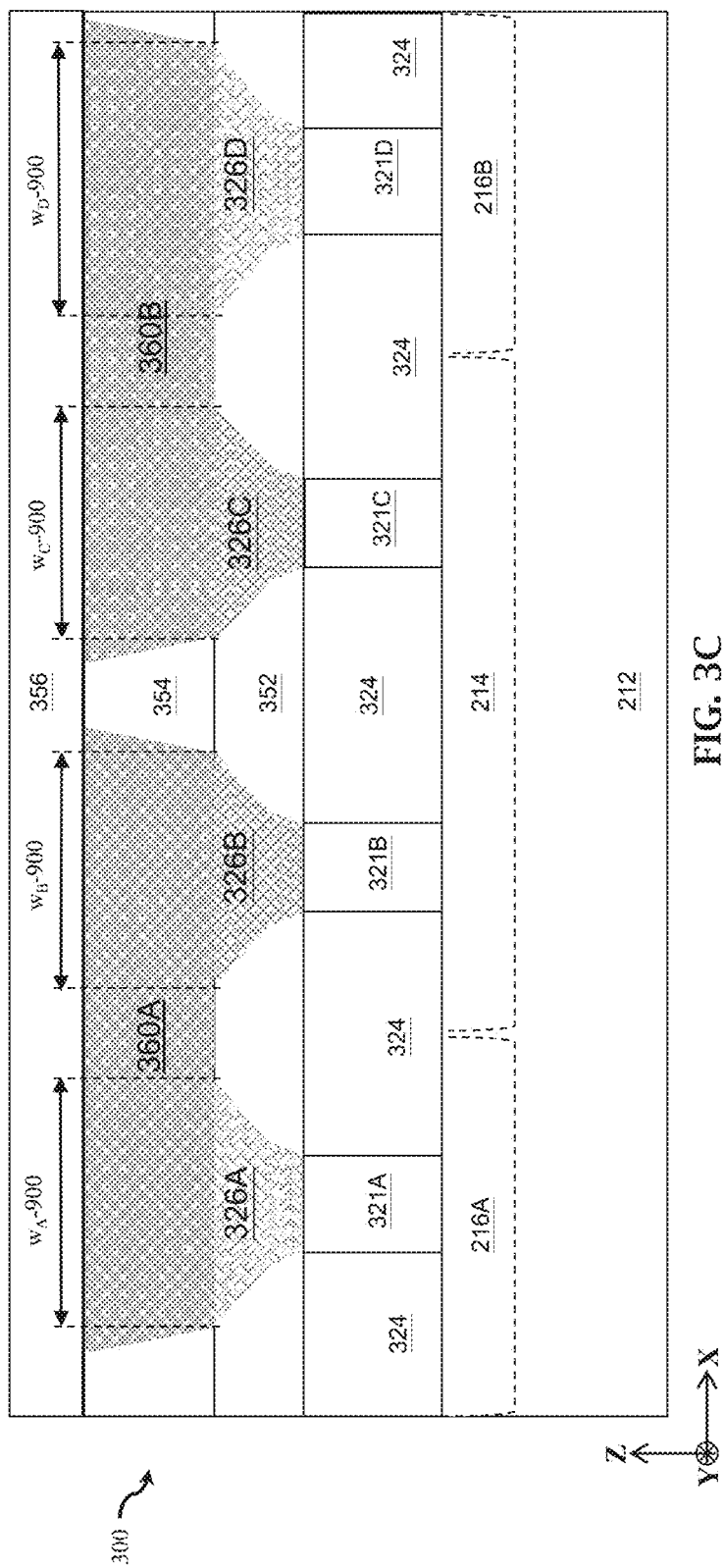

FIG. 3A is a diagrammatic top view of a portion of memory region 200 according to FIG. 2, illustrating an SRAM cell 300 of the memory region 200. FIG. 3B is a diagrammatic cross-sectional view of the SRAM cell 300 along line B-B (for example, in an x-z plane) of FIG. 3A. FIG. 3C is a diagrammatic cross-sectional view of the SRAM cell 300 along line C-C (for example, in an x-z plane) of FIG. 3A. FIG. 3D is a diagrammatic cross-sectional view of the SRAM cell 300 along line D-D (for example, in a y-z plane) of FIG. 3A. FIG. 3E is a diagrammatic cross-sectional view of the SRAM cell 300 along line E-E (for example, in a y-z plane) of FIG. 3A. FIGS. 3A-3E have been simplified for the sake of clarity to better understand the inventive concepts of the present disclosure. Additional features can be added in the SRAM cell 300, and some of the features described below can be replaced, modified, or eliminated in other embodiments of SRAM cell 300.

Referring to FIG. 3A, SRAM cell 300 may be a single-port SRAM cell. Additional features can be added in single-port SRAM cell 300, and some of the features described below can be replaced, modified, or eliminated in other embodiments of single-port SRAM cell 300. Single-port SRAM cell 300 includes six transistors: a pass-gate transistor PG-1, a pass-gate transistor PG-2, a pull-up transistor PU-1, a pull-up transistor PU-2, a pull-down transistor PD-1, and a pull-down transistor PD-2. Single-port SRAM cell 300 is thus alternatively referred to as a 6T SRAM cell 300. Pull-up transistors PU-1, PU-2 are disposed over (and electrically connected to) n-type doped region 214; pull-down transistor PD-1 and pass-gate transistor PG-1 are disposed over (and electrically connected to) p-type doped region 216A; and pull-down transistor PD-2 and pass-gate transistor PG-2 are disposed over (and electrically connected to) p-type-doped region 216B. PU-1 and PU-2 are configured as p-type transistors, while PD-1, PD-2, PG-1, and PG-2 are configured as n-type transistors (as described in more detail below).

A gate of pull-up transistor PU-1 interposes a source (electrically coupled with a power supply voltage ($V_{DD}$)) and a first common drain (CD1), and a gate of pull-down transistor PD-1 interposes a source (electrically coupled with a power supply voltage ($V_{SS}$)) and the first common drain. A gate of pull-up transistor PU-2 interposes a source (electrically coupled with power supply voltage ($V_{DD}$)) and a second common drain (CD2), and a gate of pull-down transistor PD-2 interposes a source (electrically coupled with power supply voltage ($V_{SS}$)) and the second common drain. In some implementations, the first common drain (CD1) is a storage node (SN) that stores data in true form, and the second common drain (CD2) is a storage node (SNB) that stores data in complementary form. The gate of pull-up transistor PU-1 and the gate of pull-down transistor PD-1 are coupled with the second common drain, and the gate of pull-up transistor PU-2 and the gate of pull-down transistor PD-2 are coupled with the first common drain. A gate of pass-gate transistor PG-1 interposes a source (electrically coupled with a bit line BL) and a drain, which is electrically coupled with the first common drain. A gate of pass-gate transistor PG-2 interposes a source (electrically coupled with a complementary bit line BLB) and a drain, which is electrically coupled with the second common drain. The gates of pass-gate transistors PG-1, PG-2 are electrically coupled with a word line WL. In operation, pass-gate transistors PG-1, PG-2 provide access to storage nodes SN, SNB during read operations and/or write operations. For example, pass-gate transistors PG-1, PG-2 couple storage nodes SN, SN-B respectively to bit lines BL, BLB in response to voltage applied to the gates of pass-gate transistors PG-1, PG-2 by WLs.

Each transistor includes a fin structure disposed over the substrate 212. For example, pass-gate transistor PG-1 includes a fin structure 320A; pull-down transistor PD-1 includes the fin structure 320A; pull-up transistor PU-1 includes a fin structure 320B; pull-up transistor PU-2 includes a fin structure 320C; pull-down transistor PD-2 includes a fin structure 320D; and pass-gate transistor PG-2 includes the fin structure 320D. Fin structures 320A-320D each include a base fin 321A-321D that extends from substrate 212. In the depicted embodiment, base fins 321A-321D extend to a top surface of an isolation feature 324. However, in some embodiments, base fins 321A-321D extend above a top surface of isolation feature 324. Base fins 321A-321D are oriented substantially parallel to one another along a y-direction, and each has a lateral width defined in an x-direction and a height defined in a z-direction. In some embodiments, base fins in regions of the same dopants have the same lateral widths. For example, base fins 321A and 321D are in p-type doped regions 216A and 216B, respectively. Accordingly, base fins 321A and 321D have about the same lateral widths 800a. In furtherance of the example, base fins 321B and 321C are in n-type doped region 214. Accordingly, base fins 321B and 321C have about the same lateral widths 810a. The present disclosure contemplates variations in heights, widths, and/or lengths of base fins 321A-321D that may arise from processing and fabrication of memory device. In the depicted embodiment, base fins 321A-321D have substantially the same lateral widths along their respective heights. However, in some embodiments, base fins 321A-321D may have tapered widths along their respective heights. In such embodiments, the lateral widths referenced herein are average lateral widths along the respective height of the base fins. In some embodiments, the lateral width 800a of the base fins 321A and 321D may be greater than the lateral width 810a of the base fins 321B and 321C. In some implementations, the lateral width 800a of the base fins 321A and 321D may be about 6 nm to about 70 nm; while the lateral width 810a of the base fins 321A and 321D may be about 5 nm to about 30 nm. In some implementations, a ratio of the lateral width 800a to the lateral width 810a may be about 1.1 to about 5.

Fin structures 320A-320D each further include suspended channel layers 322A-322D formed respectively over the base fins 321A-321D. The suspended channel layers 322A-322D extend between respective source/drain features 326A-326D and engage with a respective gate structure (as described in detail below), such that current can flow between the source/drain features 326A-326D through the respective suspended channel layers 322A-322D during operation. For example, source/drain features 326A are disposed over base fin 321A along its length in the y-direction. Suspended channel layers 322A are formed over base fin 321A interposing between the source/drain features 326A, such that each of suspended channel layers 322A extends between source/drain features 326A. The suspended channel layers 322A each engage with a gate structure, as further described below, such that current can flow between the source/drain features 326A through the suspended channel layers 322A during operation. Each of fin structures 320A-320D thus have a channel region (defined in respective suspended channel layers 322A-322D) extending between a source region and a drain region (generally and collectively referred to as source/drain regions and defined in respective source/drain features 326A-326D) defined along their respective lengths along the y-direction.

Each of the suspended channel layers 322A has a channel width $w_A$-300 along the x-direction and a channel thickness $t_A$-300 along the z-direction. In the depicted embodiment, each of the suspended channel layers 322A has the same channel width $w_A$-300 and/or the same channel thickness $t_A$-300. However, in some embodiments, the suspended channel layers 322A may have different channel widths and/or different channel thicknesses from one another. In such embodiments, $w_A$-300 and $t_A$-300 represent the average channel width and average channel thickness, respectively. Similarly, each of the suspended channel layers 322B has a channel width (or average channel width) $w_B$-300 and a channel thickness (or average channel thickness) $t_B$-300; each of the suspended channel layers 322C has a channel width (or average channel width) $w_C$-300 and a channel thickness (or average channel thickness) $t_C$-300; and each of the suspended channel layers 322D has a channel width (or average channel width) $w_D$-300 and a channel thickness (or average channel thickness) $t_D$-300. In some embodiments, channel thicknesses of the suspended channel layers in regions of the same doping types are about equal to each other. For example, $t_A$-300 is about equal to $t_D$-300, and $t_B$-300 is about equal to $t_C$-300. In some embodiments, channel thicknesses $t_A$-300, $t_B$-300, $t_C$-300, and $t_D$-300 are each about equal to one another, and equal to a channel thickness t-300 (generally indicating a channel thickness of suspended channel layers 322A, 322B, 322C, and 322D). Maintaining the same channel thickness between the suspended channel layers simplifies fabrication processes. Additionally, in some embodiments, channel widths of suspended channel layers in regions of the same doping types are about equal to each other. For example, channel width $w_A$-300 is about equal to $w_D$-300, and channel width $w_B$-300 is about equal to $w_C$-300. The channel widths of the suspended channel layers 322A-322D may be slightly less than the lateral widths 800a and/or 810a of the base fins 321A-321D that they overlay. For example, the channel widths of the suspended channel layers 322A-322D may be less than the lateral widths of the base fins 321A-321D that they overlay by about twice the thickness of a gate dielectric surrounding the suspended channel layers 322A-322D. In some embodiments, the channel width $w_A$-300 (and $w_D$-300) is about equal to or greater than the channel thickness t-300. For example, a ratio of the channel width $w_A$-300 (or $w_D$-300) to the channel thickness t-300 is about 1 to about 10.

In some embodiments, the channel widths of suspended channel layers in p-type doped regions (for n-type transistors) is greater than the channel widths of suspended channel layers in n-type doped regions (for p-type transistors). For example, a ratio of the channel width $w_A$-300 (or $w_D$-300) to the channel width $w_B$-300 (or $w_C$-300) is about 1 to about 5. In SRAM operations, read/write speed of the SRAM cell is largely dominated by the n-type transistors, while the p-type transistors serve to maintain stability of the SRAM cell (such as to maintain voltage to the data node). The greater channel width for the n-type transistors allows a higher maximum available drain current ($I_{on}$) and improves cell performances in high-speed applications, without substantially affecting the functionalities of the p-type transistors. In some embodiments, one or more dimensions of the suspended channel layers (such as channel widths $w_A$-300, $w_B$-300, $w_C$-300, $w_D$-300, and/or channel thickness $t_A$-300, $t_B$-300, $t_C$-300, and $t_D$-300) are within a nanometer regime (such as about 1 nm to about 100 nm). Accordingly, each collection of the suspended channel layers 322A-322D may be considered a nanostructure. The suspended channel layers 322A-322D thus may be interchangeably referred to as nanochannels. The suspended channel layers 322A-322D may be of any shape, such as wires, sheets, bars, other appropriate shapes, or combinations thereof. In some embodiments, channel widths $w_A$-300 and $w_D$-300 are about 5 nm to about 70 nm, and the channel widths $w_B$-300 and $w_C$-300 are about 5 nm to about 30 nm. In some embodiments, the channel widths $w_A$-300, $w_B$-300, $w_C$-300, and $w_D$-300 of suspended channel layers 322A-322D of SRAM cell 300 are smaller than corresponding channel widths of well straps, such as well straps of well strap cell 400 (as described later).

Fin structures 320A-320D are formed over substrate 212 using any suitable process, for example, gate-all-around processing methods. In some implementations, a combination of deposition, lithography and/or etching processes are performed to define base fins 321A-321D and suspended channel layers 322A-322D as illustrated in FIGS. 3A-3E. Base fins 321A-321D may be formed from a portion of substrate 212, therefore having the same material as substrate 212. For example, base fins 321A-321D and substrate 212 may both include silicon (Si). Additionally, base fins in regions of different dopants may include different dopants. For example, base fins 321A and 321D are formed in p-type doped regions 216A and 216B, respectively, and base fins 321B and 321C are formed in n-type doped regions 214. Accordingly, base fins 321A and 321D may include a p-type dopant (such as $B^{11}$ and/or $BF_2$) and base fins 321B and 321C may include an n-type dopant (such as $P^{31}$ and/or As). Suspended channel layers 322A-322D include a semiconductor material, such as Si, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In the depicted embodiment, suspended channel layers include silicon. Suspended channel layers 322A-322D may be formed from a material layer overlying substrate 212. In some implementations, the material layer includes alternating Si semiconductor layers and SiGe layers. During the processing, one of the alternating semiconductor layers (such as SiGe layers) are removed without substantially removing the other alternating semiconductor layers (such as Si layers), thereby creating a suspended structure. The remaining alternating semiconductor layers (such as Si layers) become the suspended channel layers 322A-322D. Suspended channel layers 322A-322D may also be doped with appropriate dopants. The dopants in the suspended channel layers 322A-322D may be the same as, or different than, the dopants in the corresponding base fins 321A-321D.

Isolation feature(s) 324 is formed over and/or in substrate 212 to isolate various regions, such as various device regions of SRAM cell 300. For example, isolation feature 324 separates and isolates base fins, such as base fins 321A-321D from one another. In the depicted embodiment, isolation feature 324 surrounds base fins 321A-321D. In some embodiments, isolation feature 324 surrounds a bottom portion of base fins 321A-321D, such that at least a portion of base fins 321A-321D protrudes above the top surface of the isolation feature 324. Isolation feature 324 includes silicon oxide, silicon nitride, silicon oxynitride, other suitable isolation material (for example, including silicon, oxygen, nitrogen, carbon, or other suitable isolation constituent), or combinations thereof. Isolation feature 324 can include different structures, such as shallow trench isolation (STI) structures, deep trench isolation (DTI) structures, and/or local oxidation of silicon (LOCOS) structures. In some implementations, STI features can be formed by etching a trench in substrate 212 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation feature 324. In some implementations, STI features can be formed by depositing an insulator material over substrate 212 after forming base fins 321A-321D, such that the insulator material layer fills gaps (trenches) between base fins 321A-321D, and etching back the insulator material layer to form isolation feature 324. In some implementations, isolation feature 324 includes a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation feature 324 includes a dielectric layer disposed over a doped liner layer (including, for example, boron silicate glass (BSG) or phosphosilicate glass (PSG)).

Each transistor also includes a gate structure. For example, pass-gate transistor PG-1 includes gate structure 350A disposed over fin structure 320A (and between source/drain features 326A); pull-down transistor PD-1 includes gate structure 350B disposed over fin structure 320A (and between source/drain features 326A); pull-up transistor PU-2 includes gate structure 350C disposed over fin structure 320C (and between source/drain features 326C); pull-transistor PU-1 includes gate structure 350D disposed over fin structure 320B (and between source/drain features 326B); pull-down transistor PD-2 includes gate structure 350E disposed over fin structure 320D (and between source/drain features 326D); and pass-gate transistor PG-2 includes gate structure 350F disposed over fin structure 320D (and between source/drain features 326D). Gate structures 350A-350F are disposed over fin structures 320A-320D. Gate structures 350A-350F each extend along the x-direction (for example, substantially orthogonal to the lengthwise direction of fin structures 320A-320D). In the depicted embodiment, gate structure 350A is disposed over a channel region of fin structure 320A and interposes a pair of source/drain features 326A, and gate structure 350B is disposed over another channel region of fin structure 320A and interposes another pair of source/drain features 326A. Gate structures 350A and 350B each engage and wrap a respective stack of suspended channel layers 322A, such that current can flow between respective source/drain regions during operation. In some embodiments, gate structures 350A and 350B are positioned such that at least one source/drain feature 326A (for example, a common drain feature or two coupled drain features) is disposed between gate structure 350A and gate structure 350B. In some implementations, gate structure 350A, a portion of fin structure 320A, and source/drain features 326A form the pass-gate transistor PG-1; and gate structure 350B, a portion of fin structure 320A, and source/drain features 326A form the pull-down transistor PD-1. Similarly, gate structures 350E and 350F are each disposed over a channel region of fin structure 320D and interpose a respective pair of source/drain features 326D. Gate structures 350E and 350F each engage and wrap a respective stack of suspended channel layers 322D, such that current can flow between respective source/drain regions during operation. In some embodiments, gate structures 350E and 350F are positioned such that at least one source/drain feature 326D (for example, a common drain feature or two coupled drain features) is disposed between gate structure 350E and gate structure 350F. In some implementations, gate structure 350E, a portion of fin structure 320D, and source/drain features 326D form the pull-down transistor PD-2; and gate structure 350F, a portion of fin structure 320D, and source/drain features 326D form the pass-gate transistor PG-2. Additionally, gate structure 350C is disposed over a channel region of fin structure 320C, interposing a pair of respective source/drain features 326C. Gate structure 350C engages and wraps a stack of suspended channel layers 322C, such that current can flow between respective source/drain regions during operation. In some implementations, gate structure 350C, a portion of fin structure 320C, and source/drain features 326C form the pull-up transistor PU-2. Furthermore, gate structure 350D is disposed over a channel region of fin structure 320B, interposing a pair of respective source/drain features 326B. Gate structure 350D engages and wraps a stack suspended channel layers 322B, such that current can flow between respective source/drain regions during operation. In some implementations, gate structure 350D, a portion of fin structure 320B, and source/drain features 326B form the pull-up transistor PU-1.

Gate structures 350A-350F each include respective gate stacks configured to achieve desired functionality according to design requirements of SRAM cell 300, such that gate structures 350A-350F include the same or different layers and/or materials from one another. In the depicted embodiment, gate structures 350A-350F have gate stacks that include gate dielectrics 325A-325F, gate electrodes 330A-330F, gate spacers 340A-340F, and hard mask layers 370A-370F. Gate structures 350A-350F may have different gate stacks formed in different doped regions, such as in n-type doped region 214 compared to in p-type doped regions 216A and 216B.

Gate dielectrics 325A-325F are conformally disposed over and around respective suspended channel layers 322A-322D and over isolation feature 324, such that gate dielectrics 325A-325F have a substantially uniform thickness. In the depicted embodiment, gate dielectrics 325A-325F are disposed directly on each of the respective suspended channel layers 322A-322D. Gate dielectrics 325A-325F include a dielectric material, such as silicon oxide, high-k dielectric material, other suitable dielectric material, or combinations thereof. In the depicted embodiment, gate dielectrics 325A-325F include a high-k dielectric layer including, for example, hafnium, aluminum, zirconium, lanthanum, tantalum, titanium, yttrium, oxygen, nitrogen, other suitable constituent, or combinations thereof. In some implementations, the high-k dielectric layer includes $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. High-k dielectric material generally refers to dielectric materials having a high dielectric constant, for example, greater than that of silicon oxide (k≈3.9). In some implementations, gate dielectrics 325A-325F each further include an interfacial layer (including a dielectric material, such as silicon oxide) disposed between the high-k dielectric layer and the respective suspended channel layers 322A-322D. In some embodiments, one or more of the gate dielectrics 325A-325F include a lanthanum dopant.

Gate electrodes 330A-330F are disposed over gate dielectrics 325A-325F. Gate electrodes 330A-330F each include an electrically conductive material. In some implementations, gate electrodes 330A-330F each include multiple layers, such as one or more capping layers, work function layers, glue/barrier layers, and/or metal fill (or bulk) layers. A capping layer can include a material that prevents or eliminates diffusion and/or reaction of constituents between gate dielectrics 325A-325F and other layers of gate structures 350A-350F (in particular, gate layers including metal). In some implementation, the capping layer includes a metal and nitrogen, such as titanium nitride (TiN), tantalum nitride (TaN), tungsten nitride ($w_2N$), titanium silicon nitride (TiSiN), tantalum silicon nitride (TaSiN), or combinations thereof. A work function layer can include a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. In some embodiments, one or more of gate electrodes 330A, 330B, 330E, and 330F include an n-type work function metal with a work function of about 4.0 eV to about 4.6 eV. In some embodiments, one or both gate electrodes 330C and 330D include a p-type work function metal with a work function of about 4.5 eV to about 5 eV. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu. Hard mask layers 370A-370F are disposed over gate electrode 330A-330F and include any suitable material, such as silicon, nitrogen, and/or carbon (for example, silicon nitride or silicon carbide).

The gate stacks of gate structures 350A-350F are fabricated according to a gate last process, a gate first process, or a hybrid gate last/gate first process. In gate last process implementations, one or more of gate structures 350A-350F include dummy gate stacks that are subsequently replaced with metal gate stacks. The dummy gate stacks include, for example, an interfacial layer (including, for example, silicon oxide) and a dummy gate electrode layer (including, for example, polysilicon). In such implementations, the dummy gate electrode layer is removed to form openings (trenches) in which gate dielectric 325A-325F and gate electrode 330A-330F are subsequently formed. Gate last processes and/or gate first processes can implement deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, e-beam writing, or ion-beam writing. The etching processes include dry etching processes, wet etching processes, other etching processes, or combinations thereof. A CMP process can be performed to remove any excess material of gate dielectrics 325A-325F, gate electrodes 330A-330F, and/or hard mask layers 370A-370F, planarizing gate structures 350A-350F.

Gate structures 350A-350F further include respective gate spacers 340A-340F disposed adjacent to (for example, along sidewalls of) the respective gate stacks. Gate spacers 340A-340F are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 212 and subsequently anisotropically etched to form gate spacers 340A-340F. In some implementations, gate spacers 340A-340F include a multilayer structure, such as a first dielectric layer that includes silicon nitride and a second dielectric layer that includes silicon oxide. In some implementations, gate spacers 340A-340F include more than one set of spacers, such as seal spacers, offset spacers, sacrificial spacers, dummy spacers, and/or main spacers, formed adjacent to the gate stacks. In such implementations, the various sets of spacers can include materials having different etch rates. For example, a first dielectric layer including silicon and oxygen can be deposited over substrate 212 and subsequently anisotropically etched to form a first spacer set adjacent to the gate stacks, and a second dielectric layer including silicon and nitrogen can be deposited over substrate 212 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features before and/or after forming gate spacers 340A-340F.

In furtherance of the depicted embodiments in FIGS. 3A-3E, gate structures 350A, 350C, and 350E extend along the x-direction, and each has a same gate width. Gate electrode 330A of the gate structure 350A is separated from the gate electrode 330C of the gate structure 350C by gate spacers 340A, 340C and interlayer dielectric (ILD) layer 352, while gate electrode 330C of the gate structure 350C directly interfaces gate electrode 330E of the gate structure 350E. Gate structures 350A, 350C, and 350E may each have different materials. For example, gate electrodes 330A and 330E may each have a different work function layer than gate electrode 330C. Therefore, gate structures 350A, 350C, and 350E collectively form a Gate-All-Around structure with three distinct gate portions adjacent to each other and extending along the x-direction. Similarly, gate structures 350B, 350D, and 350F extend along the x-direction, and each has a same gate width. Gate electrode 330B of the gate structure 350B directly interfaces gate electrode 330D of the gate structure 350D, while gate electrode 330D of the gate structure 350D is separated from gate electrode 330F of the gate structure 350F by gate spacers 340D, 340F and interlayer dielectric (ILD) layer 352. Gate structures 350B, 350D, and 350F may also have different materials. For example, gate electrodes 330B and 330F may each have a different work function layer than gate electrode 330D. Therefore, gate structures 350B, 350D, and 350F collectively form a second Gate-All-Around structure with three distinct gate portions adjacent to each other and extending along the x-direction.

Source/drain features 326A-326D are disposed in the source/drain regions of fin structures 320A-320D. For example, semiconductor material is epitaxially grown on base fins 321A-321D and on side surfaces 328, forming epitaxial source/drain features. Accordingly, source/drain features 326A-326D may also be interchangeably referred to as epitaxial source/drain features 326A-326D. Side surfaces 328 include side surfaces of the suspended channel layers 322A-322D as well as side surfaces of inner spacers 342A-342D. In the depicted embodiment, base fins 321A-321D have a top surface that extends along a top surface of the isolation feature 324. In such implementations, epitaxial source/drain features 326A-326D are grown from the top surfaces of base fins 321A-321D. In some implementations, base fins 321A-321D have a top surface that extends above a top surface of the isolation feature 324. In such implementations, epitaxial source/drain features 326A-326D are grown from and wrap at least a top portion of base fins 321A-321D. In furtherance of the depicted embodiment, epitaxial source/drain features 326A-326D each extend (grow) laterally along the x-direction (in some implementations, substantially perpendicular to the lengthwise direction of fin structures 320A-320D), such that epitaxial source/drain features 326A-326D have a greater lateral width along the x-direction than base fins 321A-321D. For example, the epitaxial source/drain features 326A-326D may have a lateral width $w_A$-900, lateral width $w_B$-900, lateral width $w_C$-900, and lateral width $w_D$-900, respectively, at their top surfaces, which interface with subsequently formed device-level contact features. Lateral widths $w_A$-900 to $w_D$-900 are greater than the corresponding lateral widths of the base fins 321A-321D, respectively. The greater lateral widths lead to greater contact surface area between the epitaxial source/drain features 326A-326D with the subsequently formed contacts, thereby providing lower resistances. In some embodiments, the lateral widths $w_A$-900 and $w_D$-900 are about 10 nm to about 100 nm, and the lateral widths $w_B$-900 to $w_C$-900 are about 10 nm to about 60 nm. In some embodiments, epitaxial source/drain features 326A-326D are merged, such that they span more than one fin structure 320A-320D and provide even greater surface area for contact.

An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of base fins 321A-321D. Source/drain features 326A-326D are doped with n-type dopants and/or p-type dopants. For example, source/drain features 326A and 326D (for n-type transistors PG-1, PD-1, PD-2, and PG-2) may be formed from epitaxial layers including silicon and/or carbon. The silicon-containing epitaxial layers or silicon-carbon-containing epitaxial layers may be doped with n-type dopants such as phosphorous, arsenic, other n-type dopant, or combinations thereof (for example, forming a Si:P epitaxial layer, a Si:C epitaxial layer, a Si:C:P epitaxial layer, or a Si:As epitaxial layer). In furtherance of the example, the source/drain features 326B and 326C (for p-type transistors PU-1 and PU-2) may be formed from epitaxial layers including silicon and/or germanium. The germanium-containing epitaxial layers, silicon germanium (SiGe) containing epitaxial layers, or silicon germanium carbide (SiGeC) containing epitaxial layers may be doped with boron, carbon, other p-type dopant, or combinations thereof. In some implementations, source/drain features 326A-326D include materials and/or dopants that achieve desired tensile stress and/or compressive stress in the channel region. In some implementations, epitaxial source/drain features 326A-326D are doped during deposition by adding impurities to a starting material of the epitaxy process. In some implementations, epitaxial source/drain features 326A-326D are doped by an ion implantation process subsequent to a deposition process. In some implementations, annealing processes are performed to activate dopants in epitaxial source/drain features 326A-326D and/or other source/drain regions, such as HDD regions and/or LDD regions. In some implementations, silicide layers are formed on epitaxial source/drain features 326A-326D. In some implementations, silicide layers 372 are formed by depositing a metal layer over epitaxial source/drain features 326A-326D. The metal layer includes any material suitable for promoting silicide formation, such as nickel, platinum, palladium, vanadium, titanium, cobalt, tantalum, ytterbium, zirconium, other suitable metal, or combinations thereof. SRAM cell 300 is then heated (for example, subjected to an annealing process) to cause constituents of epitaxial source/drain features 326A-326D (for example, silicon and/or germanium) to react with the metal. The silicide layers 372 thus include metal and a constituent of epitaxial source/drain features 326A-326D (for example, silicon and/or germanium). In some implementations, the silicide layers 372 include nickel silicide, titanium silicide, or cobalt silicide. Any un-reacted metal, such as remaining portions of the metal layer, is selectively removed by any suitable process, such as an etching process. In some implementations, the silicide layers 372 and epitaxial source/drain features 326A-326D are collectively referred to as the epitaxial source/drain features of transistors of SRAM cell 300.

A multilayer interconnect (MLI) feature 358 is disposed over substrate 212. MLI feature 358 electrically couples various devices (for example, p-type transistors PU-1 and PU-2, n-type transistors PG-1, PD-1, PD-2, and PG-2, other transistors, resistors, capacitors, and/or inductors) and/or components (for example, gate structures (for example, gate structures 350A-350F) and/or source/drain features (for example, epitaxial source/drain features 326A-326D)) of SRAM cell 300, such that the various devices and/or components can operate as specified by design requirements of SRAM cell 300. MLI feature 358 includes a combination of dielectric layers and electrically conductive layers (for example, metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI feature 358. During operation of SRAM cell 300, the interconnect features are configured to route signals between the devices and/or the components of SRAM cell 300 and/or distribute signals (for example, clock signals, voltage signals, and/or ground signals) to the devices and/or the components of SRAM cell 300. It is noted that though MLI feature 358 is depicted with a given number of dielectric layers and conductive layers, the present disclosure contemplates MLI feature 358 having more or fewer dielectric layers and/or conductive layers.

MLI feature 358 includes one or more dielectric layers, such as an interlayer dielectric layer 352 (ILD-0) disposed over substrate 212, an interlayer dielectric layer 354 (ILD-1) disposed over ILD layer 352, an interlayer dielectric layer 356 (ILD-2) disposed over ILD layer 354, as well as additional ILD layers disposed over ILD layer 356 (not shown). ILD layers 352, 354, and 356 include dielectric materials including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK® (Dow Chemical, Midland, Mich.), polyimide, other low-k dielectric material, or combinations thereof. In the depicted embodiment, ILD layers 352, 354, and 356 are dielectric layers that include a low-k dielectric material (generally referred to as low-k dielectric layers). In some implementations, low-k dielectric material generally refers to materials having a dielectric constant (k) that is less than 3. ILD layers 352, 354, and 356 can include a multilayer structure having multiple dielectric materials. MLI feature 358 can further include one or more contact etch stop layers (CESLs) disposed between ILD layers 352, 354, and 356, such as a CESL disposed between ILD layer 352 and ILD layer 354, a CESL disposed between ILD layer 354 and ILD layer 356, a CESL disposed between ILD layer 356 and additional ILD layers (not shown). In some implementations, a CESL is disposed between substrate 212 and/or isolation feature 324 and ILD layer 352. CESLs include a material different than that of ILD layers 352, 354, and 356, such as a dielectric material that is different than the dielectric material of ILD layers 352, 354, and 356. For example, where ILD layers 352, 354, and 356 include a low-k dielectric material, CESLs include silicon and nitrogen, such as silicon nitride or silicon oxynitride. ILD layers 352, 354, and 356 are formed over substrate 212 by a deposition process, such as CVD, PVD, ALD, HDPCVD, MOCVD, RPCVD, PECVD, LPCVD, ALCVD, APCVD, plating, other suitable methods, or combinations thereof. In some implementations, ILD layers 352, 354, and 356 are formed by a flowable CVD (FCVD) process that includes, for example, depositing a flowable material (such as a liquid compound) over substrate 212 and converting the flowable material to a solid material by a suitable technique, such as thermal annealing and/or ultraviolet radiation treating. Subsequent to the deposition of ILD layers 352, 354, and 356, a CMP process and/or other planarization process is performed, such that ILD layers 352, 354, and 356 have substantially planar surfaces.

Device-level contacts 360A-360J, vias 362A-362H, conductive lines 380A-380G, are disposed in ILD layers 354-356 to form a part of MLI feature 358. Device-level contacts 360A-360J, vias 362A-362H, and conductive lines 380A-380G include any suitable electrically conductive material, such as Ta, Ti, Al, Cu, Co, W, TiN, TaN, other suitable conductive materials, or combinations thereof. Various conductive materials can be combined to provide device-level contacts 360A-360J, vias 362A-362H, and conductive lines 380A-380G with various layers, such as a barrier layer, an adhesion layer, a liner layer, a bulk layer, other suitable layer, or combinations thereof. In some implementations, device-level contacts 360A-360J include Ti, TiN, and/or Co;

vias 362A-362H include Ti, TiN, and/or W; and conductive lines 380A-380G include Cu, Co, and/or Ru. Device-level contacts 360A-360J, vias 362A-362H, and conductive lines 380A-380G are formed by patterning ILD layers 354-356. Patterning ILD layers 354-356 can include lithography processes and/or etching processes to form openings (trenches), such as contact openings, via openings, and/or line openings, in ILD layers 354-356. In some implementations, the lithography processes include forming a resist layer over ILD layers 354-356, exposing the resist layer to patterned radiation, and developing the exposed resist layer, thereby forming a patterned resist layer that can be used as a masking element for etching opening(s) in ILD layers 354-356. The etching processes include dry etching processes, wet etching processes, other etching processes, or combinations thereof. Thereafter, the opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of ILD layers 354-356 and a top surface of device-level contacts 360A-360J, vias 362A-362H, and/or conductive lines 380A-380G.

Device-level contacts 360A-360J (also referred to as local interconnects or local contacts) electrically couple and/or physically couple IC device features, such as features of p-type transistors PU-1 and PU-2, n-type transistors PG-1, PD-1, PD-2, and PG-2, to each other and/or to other components of MLI feature 358, for example, vias 362A-362H of the MLI feature 358. For example, device-level contact 360A electrically connects a drain region of pull-down transistor PD-1 (formed by n-type source/drain features 326A) and a drain region of pull-up transistor PU-1 (formed by p-type source/drain features 326B), such that a common drain of pull-down transistor PD-1 and pull-up transistor PU-1 form a storage node SN. The storage node SN is further electrically connected by device-level contact 360A to a drain region of pass-gate transistor PG-1 (formed by n-type source/drain features 326A). Device-level contact 360B electrically connects a drain region of pull-down transistor PD-2 (formed by n-type source/drain features 326D) and a drain region of pull-up transistor PU-2 (formed by p-type source/drain features 326C), such that a common drain of pull-down transistor PD-2 and pull-up transistor PU-2 form a storage node SNB. The storage node SNB is further electrically connected by device-level contact 360B to a drain region of pass-gate transistor PG-2 (formed by n-type source/drain features 326D). Device-level contact 360C electrically connects a gate of pull-up transistor PU-1 (formed by gate structure 350D) and a gate of pull-down transistor PD-1 (formed by gate structure 350B) to storage node SNB. Device-level contact 360D electrically connects a gate of pull-up transistor PU-2 (formed by gate structure 350C) and a gate of pull-down transistor PD-2 (formed by gate structure 350E) to storage node SN.

A source region of pull-up transistor PU-1 (formed by p-type source/drain features 326B) is electrically connected to a power supply voltage $V_{DD}$ at a voltage node VDDN1 by device-level contact 360E, via 362A, and conductive line 380A; and a source region of pull-up transistor PU-2 (formed by p-type source/drain features 326C) is electrically connected to power supply voltage $V_{DD}$ at a voltage node VDDN2 by device-level contact 360F, via 362B, and conductive line 380A. A source region of pull-down transistor PD-1 (formed by n-type source/drain features 326A) to a power supply voltage $V_{SS}$ at a voltage node VSSN1 by device-level contact 360G, via 362C, conductive line 380B, via 390A, and conductive line 395A; and a source region of pull-down transistor PD-2 (formed by n-type source/drain features 326D) to power supply voltage $V_{SS}$ at a voltage node VSSN2 by device-level contact 360H, via 362D, conductive line 380C, via 390B, and conductive line 395B. A source region of pass-gate transistor PG-1 (formed by n-type source/drain features 326A) is electrically connected to a bit line (generally referred to as a bit line node BLN) by a device-level contact 360I, a via 362G, and conductive line 380F; and a source region of pass-gate transistor PG-2 (formed by n-type source/drain features 326D) is electrically connected to a complementary bit line (generally referred to as a bit line node BLNB) by a device-level contact 360J, a via 362H, and conductive line 380G.

Vias 362A-362H electrically couple and/or physically couple conductive features of MLI feature 358 to one another. In the depicted embodiment, vias 362A-362D, 362G, and 362H are respectively disposed on device-level contacts 360A-360J, such that epitaxial source/drain features 326A-326D are electrically coupled to conductive lines 380A-380C and 380E-380G. A gate of pass-gate transistor PG-1 (formed by gate structure 350A) is electrically connected to a word line WL at a word line node WLN1 by via 362E, conductive line 380D, via 390C, and conductive line 395C; and a gate of pass-gate transistor PG-2 (formed by gate structure 350F) is electrically connected to the word line WL at a word line node WLN2 by via 362F, conductive line 380E, via 390D, and conductive line 395C. Vias 390A-390D and conductive lines 395A-395C are similar to vias 362A-362H and conductive lines 380A-380G, respectively.

Device-level contacts 360A-360J extend through ILD layers 352-354 and vias 362A-362H extend through ILD layers 354-356, though the present disclosure contemplates embodiments where device-level contacts 360A-360J and vias 362A-362H extend through more ILD layers and/or CESLs of MLI feature 358. In some implementations, one or more of device-level contacts 360A-360J do not connect their source/drain regions to another electrically conductive feature of MLI feature 358, such as vias. In some implementations, MLI feature 358 further includes conductive lines that extend in a direction substantially orthogonal to conductive lines to form a different metal layer. The present disclosure contemplates different configurations of device-level contacts 360A-360J, vias 362A-362H, and/or conductive lines 380A-380G, depending on design requirements of SRAM cell 300.

Turning to FIGS. 4A-4E and FIGS. 5A-5E, well strap cells, such as a well strap cell 400, can be implemented in memory arrays to improve performance. Well strap cell 400 may include an n-type well strap portion 494 located in the n-type well strap area 294, and a p-type well strap portion 496 located in the p-type well strap area 296. As will be described in more detail below, n-type well strap portion 494 electrically connects n-type doped region 214 corresponding with p-type transistors (e.g. PU-1 and PU-2) of SRAM cell 300 to a voltage node (such as $V_{DD}$); and p-type well strap portion 496 electrically connects p-type doped region 216A and/or 216B corresponding with n-type transistors (e.g. PD-1, PG-1, PD-2, and PG-2) of SRAM cell 300 to a voltage node (such as $V_{SS}$). Well straps stabilize well potential for the corresponding transistors. These features are described in more details with reference to FIGS. 4A-4E and FIGS. 5A-5E below.

Figure 4B:
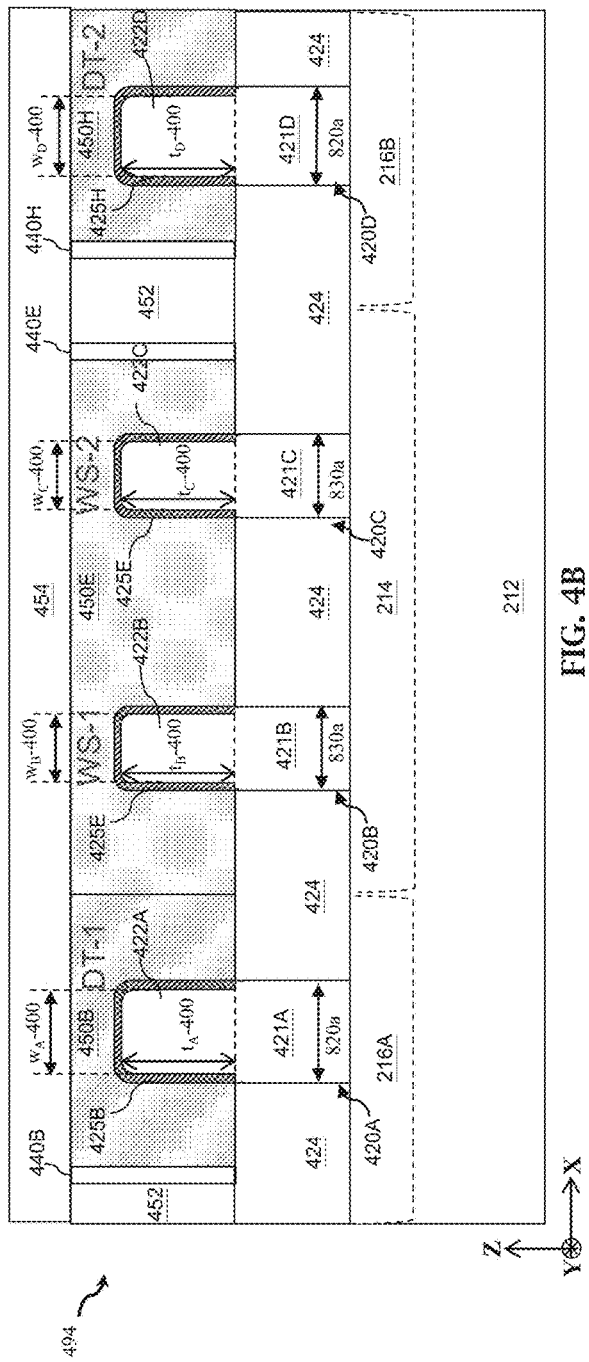

FIG. 4A is a diagrammatic top view of a portion of memory region 200 according to FIG. 2, illustrating an n-type well strap portion 494 of a well strap cell 400 of the memory region 200. FIG. 4B is a diagrammatic cross-sectional view of the n-type well strap portion 494 along line B-B (for example, in an x-z plane) of FIG. 4A. FIG. 4C is a diagrammatic cross-sectional view of the n-type well strap portion 494 along line C-C (for example, in an x-z plane) of FIG. 4A. FIG. 4D is a diagrammatic cross-sectional view of the n-type well strap portion 494 along line D-D (for example, in a y-z plane) of FIG. 4A. FIG. 4E is a diagrammatic cross-sectional view of the n-type well strap portion 494 along line E-E (for example, in a y-z plane) of FIG. 4A. FIGS. 4A-4E have been simplified for the sake of clarity to better understand the inventive concepts of the present disclosure. Additional features can be added in the n-type well strap portion 494, and some of the features described below can be replaced, modified, or eliminated in other embodiments of n-type well strap portion 494.

In FIGS. 4A-4E, n-type well strap portion 494 is formed to span across several doped regions, such as n-type doped region 214 and p-type doped regions 216A and 216B. N-type well strap portion 494 includes various features configured to achieve desired functionality. The n-type well strap portion 494 includes n-type well straps WS-1 and WS-2 disposed over the n-type doped region 214 and electrically connects the n-type doped region 214 to a voltage source (such as $V_{DD}$) through local contacts and vias (as described in detail below). Additionally, the n-type well strap portion 494 further includes dummy transistors DT-1 and DT-2 disposed over the p-type doped regions 216A and 216B, respectively. In some embodiments, the dummy transistors DT-1 and DT-2 are not be connected to a voltage. In the depicted embodiment, n-type well straps WS-1, WS-2 and dummy transistor DT-1 and DT-2 are FinFETs, and each include a fin structure disposed over the substrate 212. For example, n-type well strap WS-1 includes a fin structure 420B, n-type well strap WS-2 includes a fin structure 420C, dummy transistor DT-1 includes a fin structure 420A, and dummy transistor DT-2 includes a fin structure 420D. In the depicted embodiments, the n-type well straps WS-1 and WS-2 and dummy transistors DT-1 and DT-2 are single fin transistors. However, in some embodiments, one or more of the transistors may be multi-fin transistors in order to achieve certain design needs, for example, to achieve increased drive current.

DT-1 and DT-2 are not be connected to a voltage. In the depicted embodiment, n-type well straps WS-1, WS-2 and dummy transistor DT-1 and DT-2 are FinFETs, and each include a fin structure disposed over the substrate 212. For example, n-type well strap WS-1 includes a fin structure 420B, n-type well strap WS-2 includes a fin structure 420C, dummy transistor DT-1 includes a fin structure 420A, and dummy transistor DT-2 includes a fin structure 420D. In the depicted embodiments, the n-type well straps WS-1 and WS-2 and dummy transistors DT-1 and DT-2 are single fin transistors. However, in some embodiments, one or more of the transistors may be multi-fin transistors in order to achieve certain design needs, for example, to achieve increased drive current.

Fin structures 420A-420D may adopt any suitable fin configurations. In some implementations, fin structures 420A-420D are a portion of substrate 212. Alternatively, in some implementations, fin structures 420A-420D are defined in a material layer, such as one or more semiconductor material layers, overlying substrate 212. Fin structures 420A-420D are formed using any suitable process, such as a combination of deposition, lithography and/or etching processes.

Fin structures 420A-420D are oriented substantially parallel to one another. In the depicted embodiment, fin structures 420A-420D extend continuously from a top surface of substrate 212 to a surface that extends above a top surface of the isolation feature 424 (described below). Fin structures 420A-420D each include a lower portion 421A-421D. Lower portions 421A-421D generally refer to the portions of the fin structures 420A-420D that are below the top surface of the isolation feature 424. Lower portions 421A-421D may be similar to the base fins 321A-321D described above with reference to FIGS. 3A-3E. For example, lower portions 421A and 421D may include a p-type dopant (such as $B^{11}$ and/or $BF_2$), similar to base fins 321A and 321D, and lower portions 421B and 421C may include an n-type dopant (such as $P^{31}$ and/or As), similar to base fins 321B and 321C. The lower portions 421A-421D may each have a lateral width along the x-direction. In some embodiments, lower portions in regions of the same dopant type have the same lateral widths. For example, lower portions 421A and 421D are in p-type doped regions 216A and 216B, respectively. Accordingly, lower portions 421A and 421D have about the same lateral widths 820a. Lower portions 421B and 421C are in the n-type doped region 214. Accordingly, lower portions 421B and 421C have about the same lateral widths 830a. Similar to what was described above with reference to SRAM cell 300, the present disclosure contemplates lower portions 421A-421D having uneven widths (for example, tapered widths) along the heights of the lower portions, for example, arising from processing and fabrication of memory chip 10. In such an embodiment, the lateral widths referenced herein represent averaged lateral widths.

Fin structures 420A-420D each further include a top portion 422A-422D, generally referring to the portion of the fin structures 420A-420D that extend from the top surface of the isolation feature 424 in the channel region. The top portions 422A-422D extend between a respective pair of source/drain features 426A-426D and each engage with a respective gate structure 450A-450I. For example, a top portion 422B interposes between a pair of source/drain features 426B. The top portion 422B engages with a gate structure 450E. Therefore, the top portions 422A-422D define channel regions of the dummy FinFETs. The top portions 422A-422D are thus interchangeably referred to as fin channel layers 422A-422D.

The fin channel layers 422A-422D each have a channel width along the x-direction and a channel thickness along the z-direction. For example, fin channel layer 422A has a channel width $w_A$-400 along the x-direction and a channel thickness $t_A$-400 along the z-direction. Similarly, fin channel layer 422B has a channel width $w_B$-400 and a channel thickness $t_B$-400; fin channel layer 422C has a channel width $w_C$-400 and a channel thickness $t_C$-400; fin channel layer 422D has a channel width $w_D$-400 and a channel thickness $w_C$-400. In some embodiments, channel widths of fin channel layers in regions of the same doping type are about equal to each other. For example, channel width $w_A$-400 is about equal to $w_D$-400, and channel width $w_B$-400 is about equal to $w_C$-400. In some embodiments, channel widths $w_A$-400 (and $w_D$-400) are greater than channel widths $w_B$-400 (and $w_C$-400). The channel widths of fin channel layers 422A-422D may be slightly less than the lateral widths of the lower portions 421A-421D of fin structures 420A-420D. For example, the channel width $w_A$-400 of fin channel layer 422A may be less than the lateral width 820a by about twice the thickness of a gate dielectric around the fin channel layers. In some embodiments, channel thicknesses of fin channel layers in regions of the same doping type are about equal to each other. For example, $t_A$-400 is about equal to $t_D$-400, and $t_B$-400 is about equal to $t_C$-400. In some embodiments, channel thicknesses $t_A$-400, $t_B$-400, $t_C$-400, and $t_D$-400 are each about equal to one another, and equal to a channel thickness t-400 (generally indicating a channel thickness of fin channel layers 422A, 422B, 422C, and 422D). Maintaining the same channel thickness between the fin channel layers simplifies fabrication processes.

To enhance performance of memory chip 10, channel widths of fin channel layers 422A-422D in the n-type well strap portion 494 are greater than corresponding channel widths of the suspended channel layers 322A-322D in SRAM cell 300. For example, in the depicted embodiment, channel width $w_A$-400 of fin channel layer 422A belonging to dummy transistor DT-1 is greater than channel width $w_A$-300 of suspended channel layers 322A belonging to n-type transistors PG-1 and PD-1, channel width $w_B$-400 of fin channel layer 422B belonging to n-type well strap WS-1 is greater than channel width $w_B$-300 of suspended channel layers 322B belonging to p-type transistor PU-1, channel width $w_C$-400 of fin channel layer 422C belonging to n-type well strap WS-2 is greater than channel width $w_C$-300 of suspended channel layers 322C belonging to p-type transistor PU-2, and channel width $w_D$-400 of fin channel layer 422D belonging to dummy transistor DT-2 is greater than channel width $w_D$-300 of suspended channel layers 322D belonging to n-type transistors PG-2 and PD-2. Increasing channel widths of well straps (here, $w_B$-400 and $w_C$-400) reduces well pick-up resistance exhibited by n-type well straps WS-1 and WS-2, improving performance of memory chip 10. In some implementations, a ratio of the channel width of an n-type well strap to a channel width of a corresponding p-type transistor (for example, a channel width of suspended channel layers 322B or 322C) in SRAM cell 300 is about 1.05 to about 5. In some embodiments, $w_A$-300 to $w_D$-300 are each less than about 20 nm, and $w_B$-300 to $w_C$-300 are each less than about 10 nm, while $w_A$-400 and $w_D$-400 are each greater than about 15 nm (for example, about 15 nm to about 200 nm), and $w_B$-400 and $w_C$-400 are each greater than about 10 nm (for example, about 10 nm to about 200 nm). In some embodiments, the $w_A$-300 is less than about 20 nm, and the $w_A$-400 is greater than about 20 nm. In some embodiments, the $w_A$-300 is less than $w_A$-400 by at least about 5 nm. Additionally, the channel thickness t-400 of the channels of fin channel layers 422A-422D may be greater than the channel thickness t-300 of the channels of the suspended channel layers 322A-322D. In some embodiments, a ratio of the channel thickness t-400 to the channel thickness t-300 is about 5 to about 20. The increased channel thickness t-400 contributes to the reduced pick-up resistance exhibited by the n-type well straps WS-1 and WS-2. Additionally, the fin channel layers 422A-422D continuously extend vertically from the bottom surface of the fin channel layers 422A-422D to the top surface of the fin channel layers 422A-422D without interposing dielectric materials. This further contributes to the reduced pick-up resistance exhibited by the n-type well strap WS-1 and WS-2.

Epitaxial source/drain features 426A-426D may have physical characteristics generally resembling epitaxial source/drain features 326A-326D discussed above with reference to FIGS. 3A-3E. However, in the depicted embodiments, unlike epitaxial source/drain features 326A-326D each having a dopant of an opposite type to the dopant in the substrate region in which they are disposed, the source/drain features 426A-426D are each doped with n-type dopants (such as $P^{31}$ and/or As) regardless of their respective locations (such as the epitaxial source drain feature being disposed in n-type doped region 214 or in p-type doped region 216A or 216B). In other words, the n-type well straps WS-1, WS-2 and the dummy transistors DT-1 and DT-2 are each configured with n-type source/drain features. The epitaxial source/drain features 426A-426D may have higher epitaxial crystal quality than the epitaxial source/drain features 326A-326D. For example, epitaxial source/drain features 426A-426D are each formed on side surfaces 428, similar to epitaxial source/drain features 326A-326D being each formed on side surfaces 328 (see FIGS. 3D and 3E). Unlike side surfaces 328, which include semiconductor material of the suspended channel layers interposed by dielectric material of the inner spacers, side surfaces 428 include semiconductor materials extending continuously throughout the surface. Because epitaxial source/drain features grow on semiconductor substrates but not on dielectric substrates, the epitaxial source/drain features 426A-426D have better quality than the epitaxial source/drain features 326A-326D. The epitaxial source/drain features 426A, 426B, 426C, and 426D have a lateral width $w_A$-940, $w_B$-940, $w_C$-940, $w_D$-940, respectively. They are greater than lateral widths $w_A$-900, $w_B$-900, $w_C$-900, $w_D$-900, respectively. Epitaxial source/drain features in regions of the same dopant type may have lateral widths about the same as each other. Therefore, lateral width $w_A$-940 may be about the same as $w_D$-940, and lateral width $w_B$-940 may be about the same as $w_C$-940. In some embodiments, the lateral widths $w_A$-940 and $w_D$-940 are about 15 nm to about 150 nm, and the lateral widths $w_B$-940 to $w_C$-940 are about 12 nm to about 70 nm.

Gate structures 450A-450I are disposed over fin structures 420A-420D. These gate structures are similar to those gate structures 350A-350F described above with respect to FIGS. 3A-3E (including, for example, gate dielectrics 425A-425I, gate electrodes 430A-430I, hard masks 470A-470I, and/or gate spacers 440A-440I similar to gate dielectric 325A-325F, gate electrode 330A-330F, hard masks 370A-370F, and/or gate spacers 340A-340F as described above with reference to FIGS. 3A-3E). Also similar to the gate structures 350A-350F, gate structures 450A-450I are configured as tri-gate structures. For example, gate structures 450A, 450D, and 450G extend along the x-direction, and each has a same gate width. Gate electrode 430A of the gate structure 450A directly interfaces gate electrode 430D of the gate structure 450D, while gate electrode 430D of the gate structure 450D is separated from gate electrode 430G of the gate structure 450G by gate spacers 440D, 440G, and ILD 452. Gate structures 450A, 450D, and 450G may each have different materials. For example, gate electrodes 430A and 430G may each have a different work function layer from the gate electrode 430D. Accordingly, gate structures 450A, 450D, and 450G form a tri-gate structure with three distinct gate portions adjacent to each other and extending along the x-direction. Similarly, gate structures 450B, 450E, and 450H may form a second tri-gate structure; and gate structures 450C, 450F, and 450I may form a third tri-gate structure. In some embodiments, gate structures 450A-450C may have the same material composition as gate structures 350A-350B; gate structures 450D-450F may have the same material composition as gate structures 350C-350D; and/or gate structures 450G-450I may have the same material composition as gate structures 350E-350F.

Fin structure 420A, gate structure 450B, and epitaxial source/drain features 426A form dummy transistor DT-1; fin structure 420B, gate structure 450E, and epitaxial source/drain features 426B form n-type well strap WS-1 (which is a dummy FinFET); fin structure 420C, gate structure 450E, and epitaxial source/drain features 426C form n-type well strap WS-2 (which is a dummy FinFET); and fin structure 420D, gate structure 450H, and epitaxial source/drain features 426D form dummy transistor DT-2. Additionally, n-type well strap portion 494 further includes isolation feature 424 (similar to isolation feature 324 described above with reference to FIGS. 3A-3E).

The n-type well strap portion 494 further includes an MLI feature 458 (similar to MLI feature 358 described above with reference to FIGS. 3A-3E). For example, MLI feature 458 includes ILD layers 452-456 (similar to ILD layers 352-356 described above with reference to FIGS. 3A-3E), device-level contacts 460A-460B (similar to device-level contacts 360A-360J described above with reference to FIGS. 3A-3E), vias 462A-462B (similar to vias 362A-362H described above with reference to FIGS. 3A-3E), and conductive lines (not shown, similar to conductive lines 380A-380G described above with reference to FIGS. 3A-3E). The device-level contacts 460A and 460B are disposed on respective epitaxial source/drain features 426B and 426C, such that device-level contacts 460A and 460B physically (or directly) connect the source/drain regions of n-type well straps WS-1 and WS-2 respectively to vias 462A and 462B. The vias 462A and 462B further connects the device-level contacts 460A and 460B to conductive lines (not shown) such that the n-type doped region 214 is coupled to a voltage source (for example, $V_{DD}$). In some embodiments, the dummy transistors are not connected to a voltage.

Figure 5B:
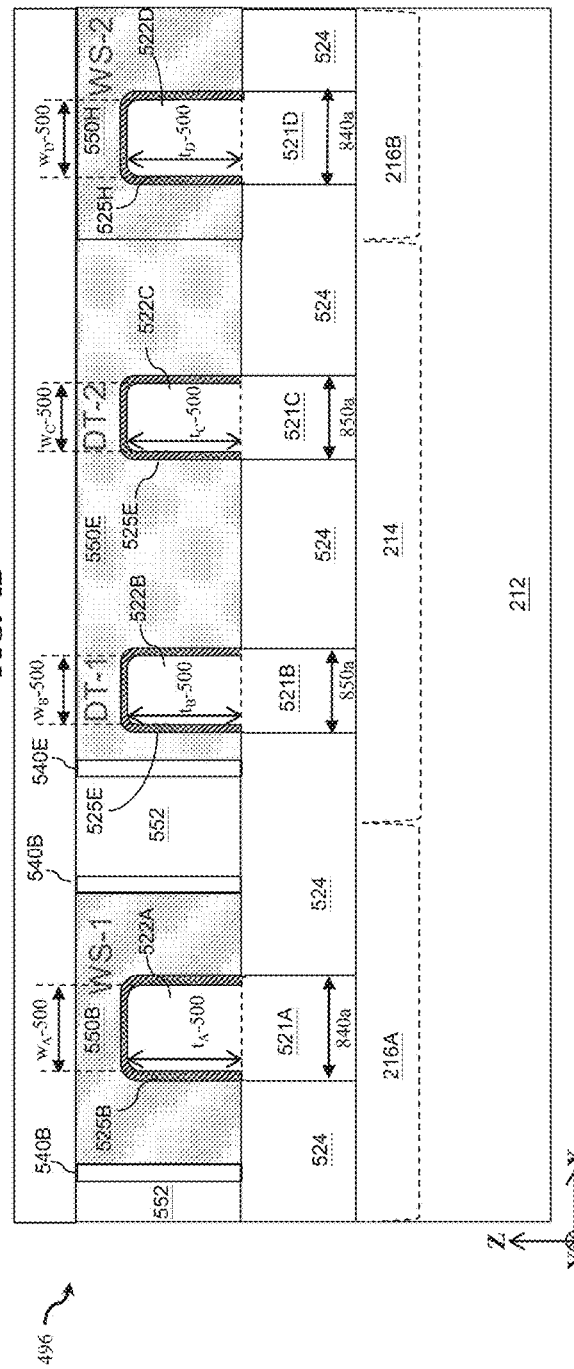
Figure 6:
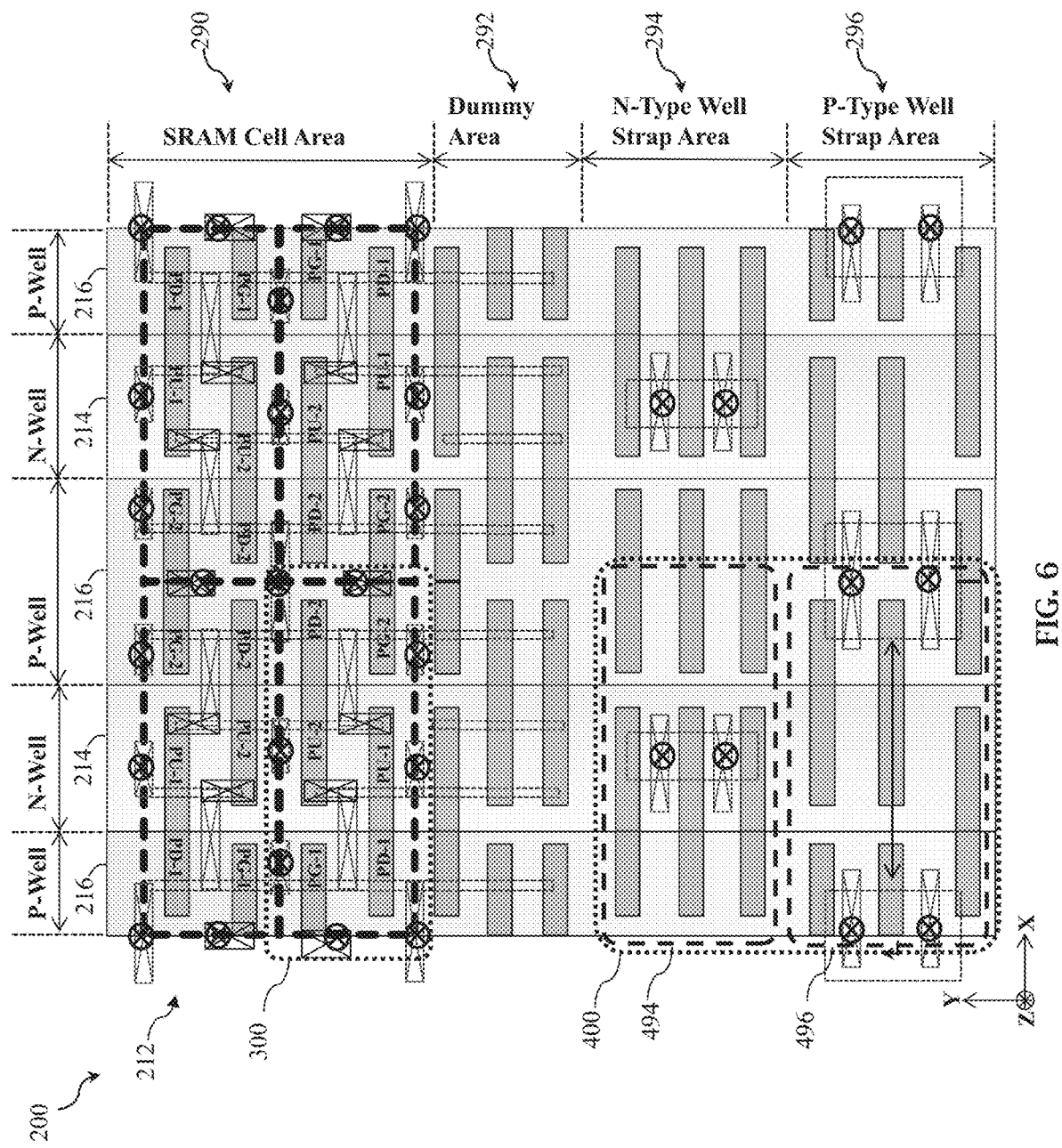
FIG. 6 is a diagrammatic plan view of a memory region, in portion or entirety, which can be implemented in a memory chip, according to various aspects of the present disclosure.
Figure 7A:
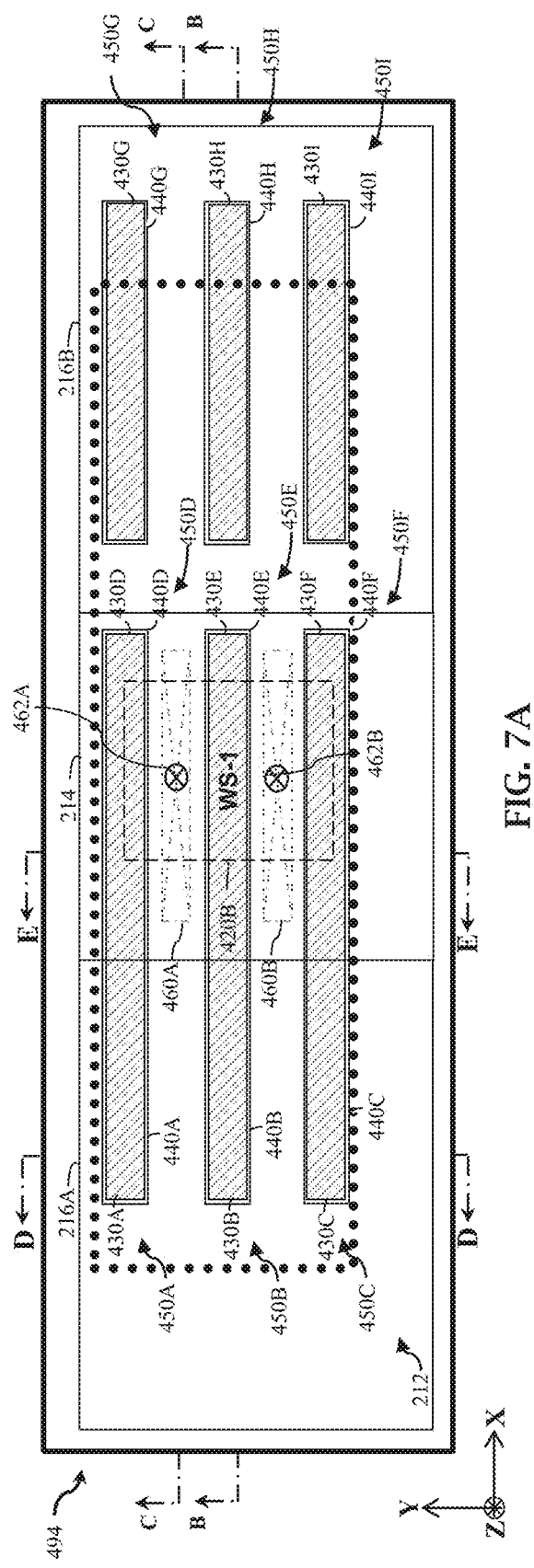
Figure 8A:
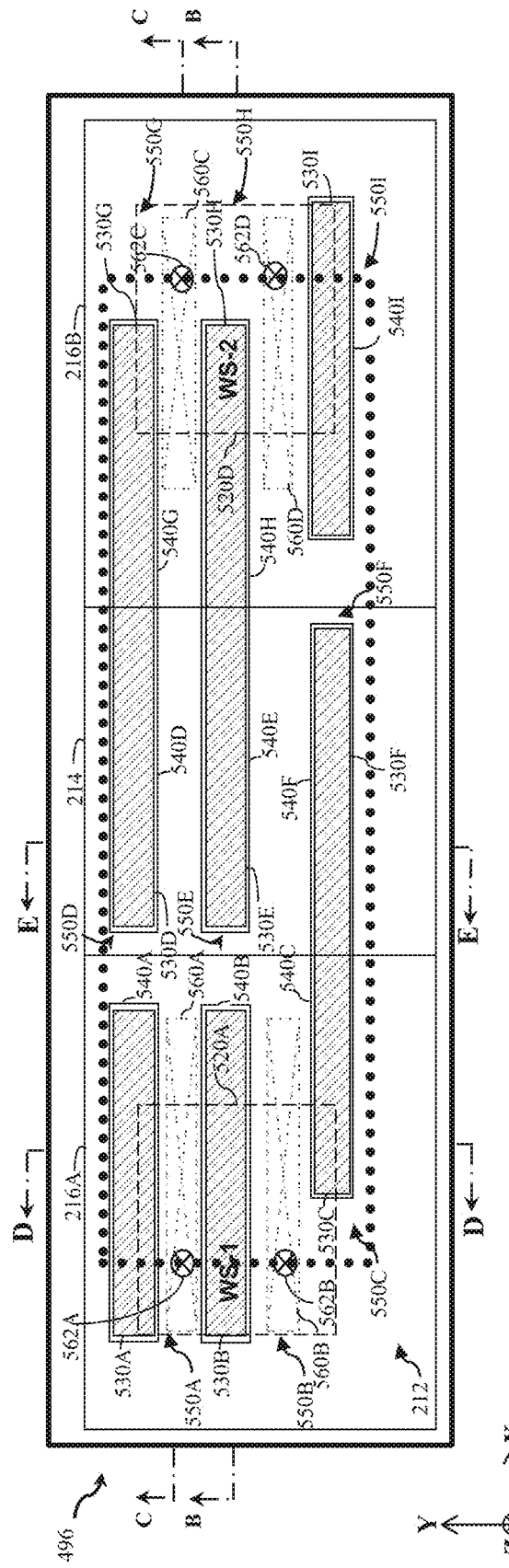
Figure 7B:
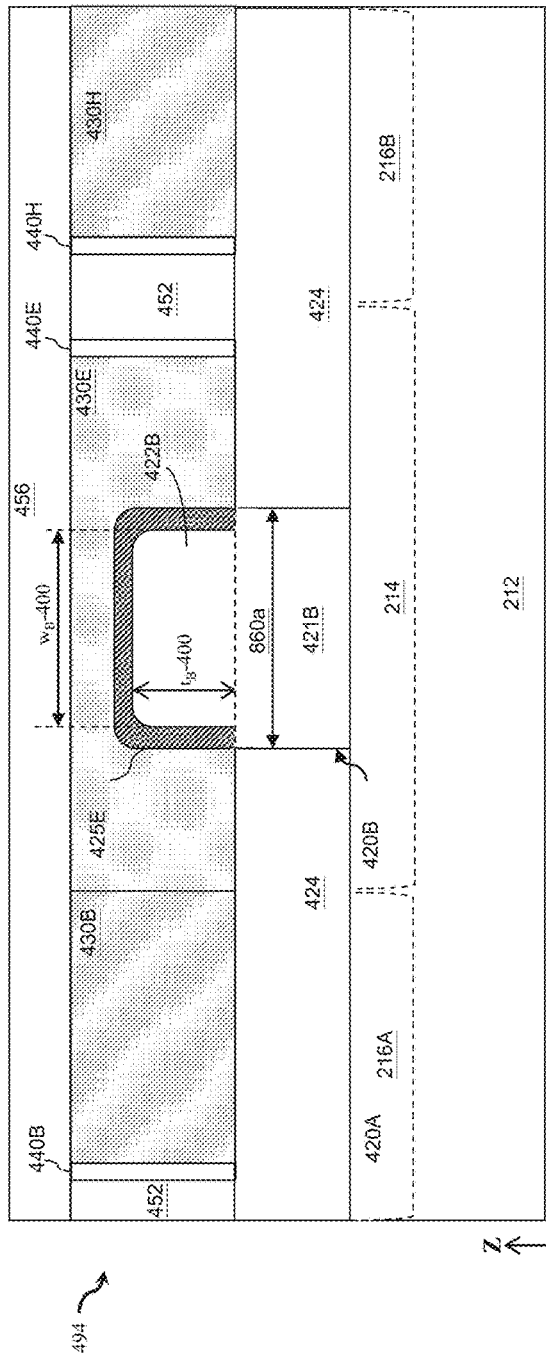
Figure 8B:
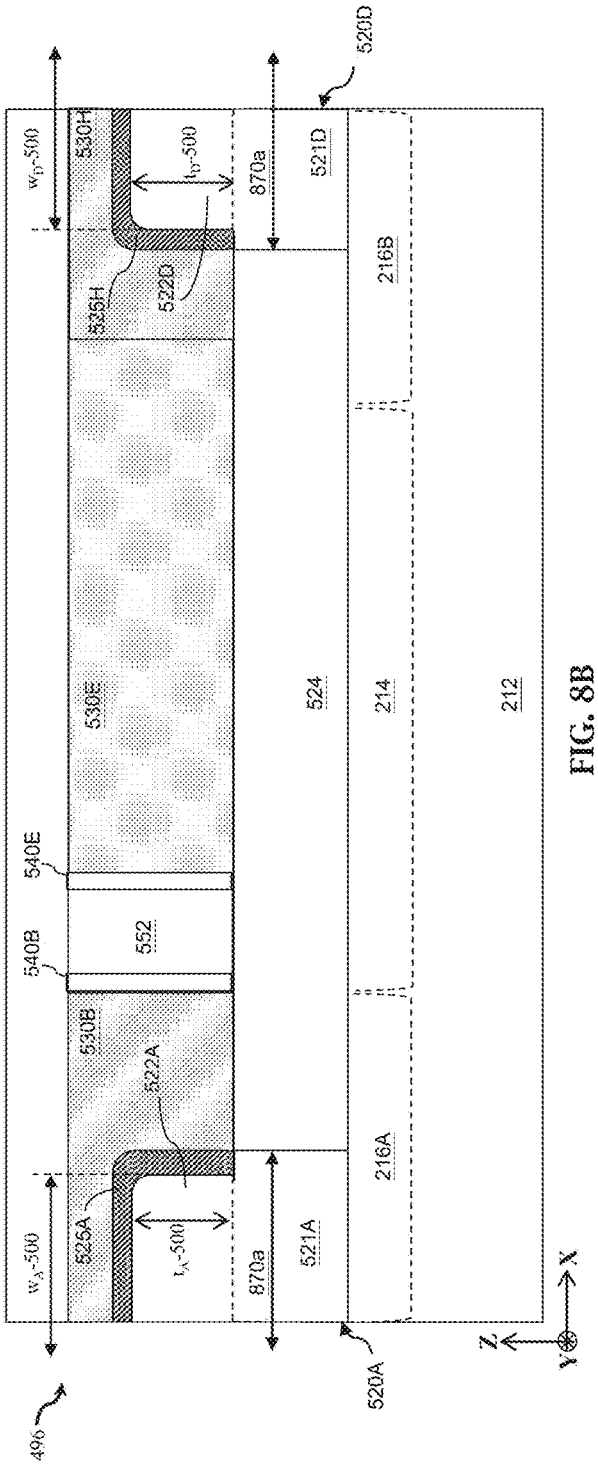

FIG. 5A is a diagrammatic top view of a portion of memory region 200 according to FIG. 2, illustrating a p-type well strap portion 496 of a well strap cell 400 of memory region 200. FIG. 5B is a diagrammatic cross-sectional view of the p-type well strap portion 496 along line B-B (for example, in an x-z plane) of FIG. 5A. FIG. 5C is a diagrammatic cross-sectional view of the p-type well strap portion 496 along line C-C (for example, in an x-z plane) of FIG. 5A. FIG. 5D is a diagrammatic cross-sectional view of the p-type well strap portion 496 along line D-D (for example, in a y-z plane) of FIG. 5A. FIG. 5E is a diagrammatic cross-sectional view of the p-type well strap portion 496 along line E-E (for example, in a y-z plane) of FIG. 5A. These figures have been simplified for the sake of clarity to better understand the inventive concepts of the present disclosure. Additional features can be added in the p-type well strap portion 496, and some of the features described below can be replaced, modified, or eliminated in other embodiments of p-type well strap portion 496.

The physical features of the p-type well strap portion 496 generally resemble those of the n-type well strap portion 494. For example, the p-type well strap portion 496 are formed across several doped regions (such as n-type doped region 214 and p-type doped regions 216A and 216B) and also include a plurality of p-type well straps WS-1 and WS-2 in the p-type doped regions 216A and 216B as well as a plurality of dummy transistors DT-1 and DT-2 in the n-type doped region 214. Similar to the n-type well strap portion 494, the p-type well strap portion 496 includes fin structures 520A-520D (similar to the fin structures 420A-420D of the n-type well strap portion 494 described above with reference to FIGS. 4A-4E). The fin structures 520A-520D each include lower portions 521A-521D (similar to the lower portions 421A-421D of the n-type well strap portion 494 described above with reference to FIGS. 4A-4E) and top portions 522A-522D (similar to the top portions 422A-422D of the n-type well strap portion 494 described above with reference to FIGS. 4A-4E), also referred to as fin channel layers 522A-522D. Each fin structure includes at least a source region, a drain region and a channel region. At least one pair of epitaxial source/drain features 526A-526D are disposed on lower portions 521A-521D in the source/drain regions (similar to the epitaxial source/drain features 426A-426D of the n-type well strap portion 494 described above with reference to FIGS. 4A-4E). Fin channel layers 522A-522D in the channel regions extend between the epitaxial source/drain features 526A-526D and engage a respective gate structure 550A-550I.

The p-type well strap portion 496 differs from the n-type well strap portion 494 in that the epitaxial source/drain features 526A-526D are doped with p-type dopants (such as $B^{11}$ and/or $BF_2$), regardless of their respective locations. In other words, transistors WS-1, WS-2, DT-1, and DT-2 of the p-type well strap portion 496 are each configured with p-type source/drain features. The lower portions 521A-521D each have a lateral width along the x-direction. For example, the lower portions 521A and 521D in the p-type doped regions 216A and 216B have lateral widths 840a, and the lower portions 521B and 521C in the n-type doped region 214 have lateral widths 850a. In some embodiments, the lateral widths of the lower portions 521A-521D are greater than the corresponding lateral widths of the lower portions 421A-421D. For example, a ratio of the lateral width 840a to the lateral width 820a may be about 1.1 to about 10. In some embodiments, the lateral widths of the lower portions 521A-521D are smaller than the corresponding lateral widths of the lower portions 421A-421D. For example, a ratio of the lateral width 830a to the lateral width 850a may be about 1.1 to about 5. In some embodiments, the lateral widths 840a and 820a are about equal to each other, and the lateral widths 830a and 850a are about equal to each other. The fin channel layers 522A-522D each have a lateral width along the x-direction. For example, the fin channel layers 522A and 522D in the p-type doped regions 216A and 216B each have lateral widths $w_A$-500 and $w_D$-500, respectively, and the fin channel layers 522B and 522C in the n-type doped region 214 each have lateral widths $w_B$-500 and $w_C$-500, respectively. In some embodiments, the WS lateral widths of the fin channel layers 522A-522D and 422A-422D are greater than the corresponding DT lateral widths. For example, a ratio of the lateral width $w_A$-500 (or $w_D$-500) to the lateral width $w_A$-400 (or $w_D$-400) may be about 1.1 to about 10; and a ratio of the lateral width $w_B$-400 (or $w_C$-400) to the lateral width $w_B$-500 (or $w_C$-500) may be about 1.1 to about 5.

In some embodiments, the channel widths $w_A$-500 and $w_D$-500 may be greater than about 15 nm (for example, about 15 nm to about 200 nm), and the channel widths $w_B$-500 and $w_C$-500 may be greater than about 10 nm (for example, about 10 nm to about 200 nm). In addition, the channel of fin channel layers 522A-522D may each have a channel thickness t-500 along the z-direction, which may be similar to the channel thickness t-400 of the channels of fin channel layers 422A-422D. Accordingly, in some embodiments, a ratio of the channel thickness t-500 to the channel thickness t-300 is about 5 to about 20. Similar to n-type well strap portion 494, the greater channel thickness t-500 as compared to the thickness t-300, as well as the continuous distribution of the semiconductor material in the fin channel layers 522A-522D, contribute to the reduced pick-up resistance of the p-type well straps, WS-1 and WS-2. Additionally, the greater channel width (and the greater lateral width of the fin channel layer) allows for the formation of epitaxial source/drain features of greater lateral widths over the fin channel layers. The greater lateral widths for the epitaxial source/drain features in turn allow for better containment of the dopant within the epitaxial source/drain features such that their out-diffusions are mitigated. This further contributes to a reduced pick-up resistance. For example, the p-type dopant boron ($B^{11}$) is known to out-diffuse into adjacent oxide layers, thereby contributing to an increased resistance for the p-well pickup active region. The increased dimension of the epitaxial source/drain features reduces the probability of out-diffusion of the boron dopant, thereby mitigating the associated pick-up resistance increase.

Gate structures 550A-550I are disposed over fin structures 520A-520D. These gate structures resemble those gate structures 450A-450I already discussed above with reference to FIGS. 4A-4E. For example, gate structures 550A, 550D, and 550G extend along the x-direction, and each has a same gate width. Gate electrode 530A of the gate structure 550A is disposed adjacent to and separated from the gate electrode 530D of the gate structure 550D by gate spacers 540A, 540D, and ILD 552, while gate electrode 530D of the gate structure 550D directly interfaces gate electrode 530G of the gate structure 550G. Similarly, gate structures 550B, 550E, and 550H extend along the x-direction, and each has a same gate width. Gate electrode 530B of the gate structure 550B is disposed adjacent to and separated from gate electrode 530E of the gate structure 550E by gate spacers 540B, 540E, and ILD 552, while gate electrode 530E of the gate structure 550E directly interfaces gate electrode 530H of the gate structure 550H. Gate structures 550C, 550F, and 550I extend along the x-direction, and each has a same gate width. Gate electrode 530C of the gate structure 550C directly interfaces gate electrode 530F of the gate structure 550F, while gate electrode 530F of the gate structure 550F is separated from gate electrode 530I of the gate structure 550I by gate spacers 540F, 540I, and ILD 552. Gate structures 550A, 550D, and 550G may each have different materials and form a tri-gate structure; gate structures 550B, 550E, and 550H may each have different materials and form a tri-gate structure; and gate structures 550C, 550F, and 550I may each have different materials and form a tri-gate structure. In some embodiments, gate structures 550A-550C may have the same material composition as gate structures 350A-350B and/or gate structures 450A-450C; gate structures 550D-550F may have the same material composition as gate structures 350C-350D and/or gate structures 450D-450F; and gate structures 550G-550I may have the same material composition as gate structures 350E-350F and/or gate structures 450G-450I.

Fin structure 520A, gate structure 550B, and epitaxial source/drain features 526A form p-type well strap WS-1 (which is a dummy FinFET); fin structure 520B, gate structure 550E, and epitaxial source/drain features 526B form dummy transistor DT-1; fin structure 520C, gate structure 550E, and epitaxial source/drain features 526C form dummy transistor DT-2; and fin structure 520D, gate structure 550H, and epitaxial source/drain features 526D form p-type well strap WS-2 (which is a dummy FinFET). Additionally, p-type well strap portion 496 further includes isolation feature 524 (similar to isolation feature 424 described above with reference to FIGS. 4A-4E).

Similar to the n-type well strap portion 494, the p-type well strap WS-1 and WS-2 of the p-type well strap portion 496 are electrically connected to voltages through an MLI feature 558 (similar to the MLI feature 458 described above with reference to FIGS. 4A-4E). For example, device level contact 560A and 560B are disposed on epitaxial source/drain features 526A; and device level contact 560C and 560D are disposed on epitaxial source/drain features 526D. In some embodiments, device level contacts 560A-560D each connect the respective p-type well straps to p-type well straps of an adjacent well strap cell. In other words, the device level contacts 560A-560D overlap with the boundary of the well strap cell 400. The vias 562A and 562B further connect the device-level contacts 560A and 560B to conductive lines (not shown) such that the p-type doped regions 216A and 216B are coupled to a voltage source (for example, $V_{SS}$). And vias 562C and 562D further connects the device-level contacts 560C and 560D to conductive lines (not shown) such that the p-type doped regions 216A and 216B are coupled to a voltage source (for example, $V_{SS}$). In some embodiments, the vias 562A-562D are disposed on portions of boundaries of the well strap cell 400. In some embodiments, the dummy transistors are not connected to a voltage.

In some embodiments, as illustrated in FIGS. 6, 7A-7E and 8A-8E, the n-type well strap portion 494 and/or the p-type well strap portion 496 may alternatively include a fin that occupy a greater area on the memory chip 10 than the area occupied by two or more corresponding base fins of the SRAM cell 300. For example, the n-type well strap portion 494 may alternatively be configured according to FIG. 7A-7E. The configuration of n-type well strap portion 494 according to FIG. 7A-7E shares similar characteristics of the n-type well strap portion 494 described above with references to FIGS. 4A-4E. However, as illustrated in FIGS. 7A-7E, the n-type well strap portion 494 may include fewer n-type well straps and each may have wider fins. For example, as illustrated in FIGS. 7A-7E, the n-type well strap portion 494 includes only one n-type well strap, that is, WS-1. The n-type well strap WS-1 is formed from fin structure 420B. Accordingly, one pair of epitaxial source/drain features 426B are formed on the lower portion 421B of the fin structure 420B. The fin structure 420B has a lateral width (or average lateral width) 860a. The fin channel layer 422B has a channel width of $w_B$-400 that is greater than about 30 nm. For example, the channel width $w_B$-400 may be about 30 nm to about 200 nm. The wider channel width further reduces the pickup resistance of the n-type well strap WS-1, thereby improving performance of the memory chip 10. Device-level contacts 460A and 460B may be formed on the epitaxial source/drain features 426B, which electrically connect the epitaxial source/drain features 426B to vias 462A and 462B, respectively. The vias 462A and 462B, in turn, electrically connect the device level contacts to voltage sources (for example, $V_{DD}$). In some embodiments, the n-type well strap portion 494 includes no additional dummy transistors (such as DT-1 or DT-2).

For another example, the p-type well strap portion 496 may be configured according to FIG. 8A-8E. The configuration of p-type well strap portion 496 according to FIG. 8A-8E shares similar characteristics of the p-type well strap portion 496 described above with references to FIGS. 5A-5E. However, the p-type well strap portion 496 according to FIG. 8A-8E may include effectively fewer p-type well straps and each has wider fins. For example, as illustrated in FIGS. 8A-8E, the p-type well strap portion 496 includes p-type well straps WS-1 and WS-2. The p-type well straps WS-1 and WS-2 are formed from fin structures 520A and 520D, respectively. The fin structures 520A and 520D each overlay a portion of the cell boundary of the well strap cell 400. Effectively, therefore, these p-type well straps are shared by well strap cell 400 with adjacent well straps. One pair of epitaxial source/drain features 526A are formed on the lower portion 521A of the fin structure 520A, and one pair of epitaxial source/drain features 526D are formed on the lower portion 521D of the fin structure 520D. The fin structures 520A and 520D each have a lateral width (or average lateral width) 870a. The fin channel layers 522A and 522D each have channel widths $w_A$-500 and $w_D$-500, respectively, that are greater than about 30 nm. For example, the channel width $w_A$-500 and $w_D$-500 may be about 30 nm to about 200 nm. Similarly, the wider channel width reduces the pickup resistance of the p-type well straps WS-1 and WS-2, thereby improving performance of the memory chip 10. In other words, well strap cell 400 includes only a portion of the fin structure 520A (hence a portion of WS-1) and a portion of the fin structure 520D (hence a portion of WS-2). Device level contacts 560A and 560B may be formed on the epitaxial source/drain features 526A, which electrically connect the epitaxial source/drain features 526A to vias 562A and 562B; device level contacts 560C and 560D may be formed on the epitaxial source/drain features 526D, which electrically connect the epitaxial source/drain features 526D to vias 562C and 562D. The vias 562A-562D, in turn, electrically connect the device level contacts to voltage sources (for example, $V_{SS}$). In some embodiments, the p-type well strap portion 496 includes no additional dummy transistors (such as DT-1 or DT-2). In some embodiments, the vias 562A-562D overlap with portions of the cell boundary of the well strap cell 400.

The present disclosure contemplates a memory chip 10 that includes a memory region 200 having a SRAM cell 300 and a well strap cell 400. The SRAM cell 300 is configured according to FIGS. 3A-3E. The well strap cell 400 includes an n-type well strap portion 494 and a p-type well strap portion 496. The n-type well strap portion 494 may be configured according to FIG. 4A-4E or 7A-7E, and the p-type well strap portion 496 may be configured according to FIG. 5A-5E or 8A-8E. In other words, in some embodiments, the n-type well strap portion 494 of the well strap cell 400 is illustrated in FIGS. 4A-4E, and the p-type well strap portion 496 of the well strap cell 400 is illustrated in FIGS. 5A-5E; in some embodiments, the n-type well strap portion 494 of the well strap cell 400 is illustrated in FIGS. 7A-7E, and the p-type well strap portion 496 of the well strap cell 400 is illustrated in FIGS. 5A-5E; in some embodiments, the n-type well strap portion 494 of the well strap cell 400 is illustrated in FIGS. 4A-4E, and the p-type well strap portion 496 of the well strap cell 400 is illustrated in FIGS. 8A-8E; and in some embodiments, the n-type well strap portion 494 of the well strap cell 400 is illustrated in FIGS. 7A-7E, and the p-type well strap portion 496 of the well strap cell 400 is illustrated in FIGS. 8A-8E.

Figure 9:
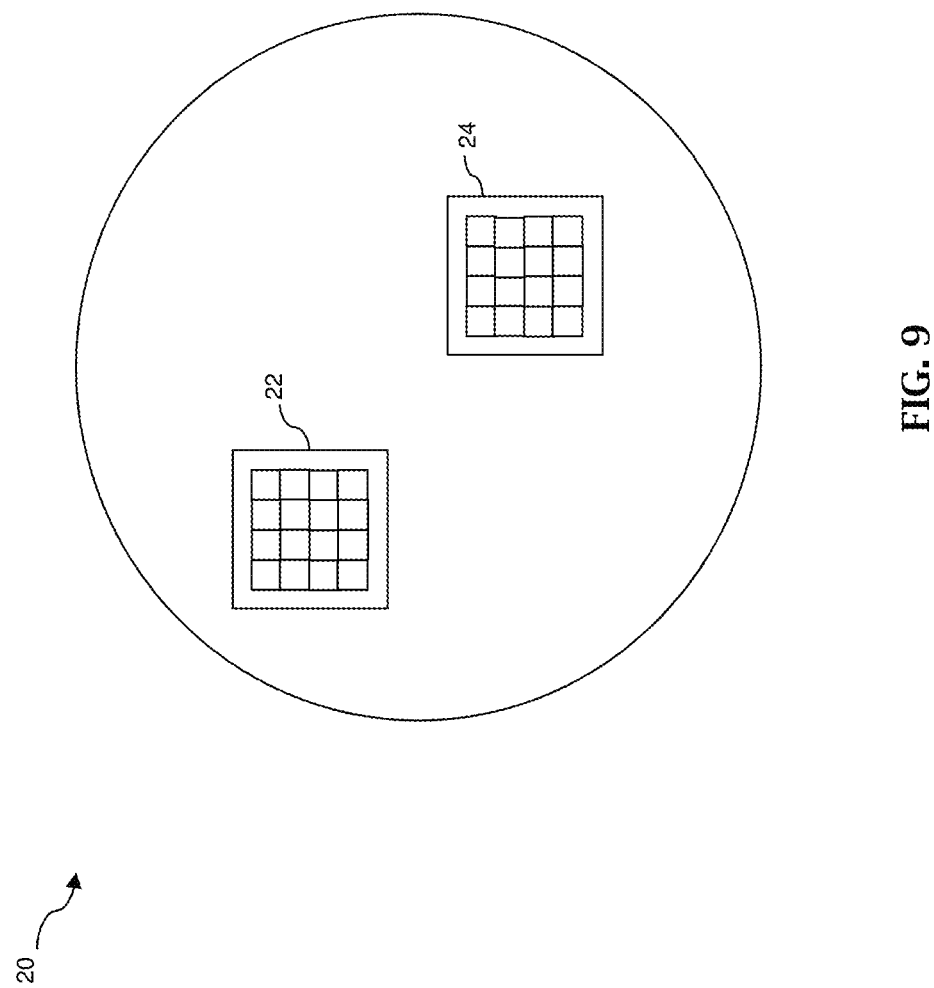
FIG. 9 is a diagrammatic plan view of an integrated circuit device, in portion or entirety, according to various aspects of the present disclosure.

FIG. 9 is a plan view of a memory chip 20, in portion or entirety, according to various aspects of the present disclosure. The memory chip 20 includes a memory array 22 and an input/output (I/O) region 24. The memory array 22 may be similar to any of the memory arrays 10A, 10B, 10C described here, or combinations thereof. The I/O region 24 includes a plurality of I/O cells. The I/O cells may each include FinFET areas that are configured similar to the n-type well strap portion 494 and/or the p-type well strap portion 496. The similar configurations allow for simultaneous processing of the I/O cells and the well strap cells. Accordingly, minimal additional processing cost for well straps is required. In some embodiments, the I/O cells may include fins that have lateral widths greater than the lateral widths of the n-type well strap portion 494 and/or p-type well strap portion 496. For example, the I/O cells may have FinFETs having a lateral width of about 4 nm to about 10 nm.

Figure 10A:
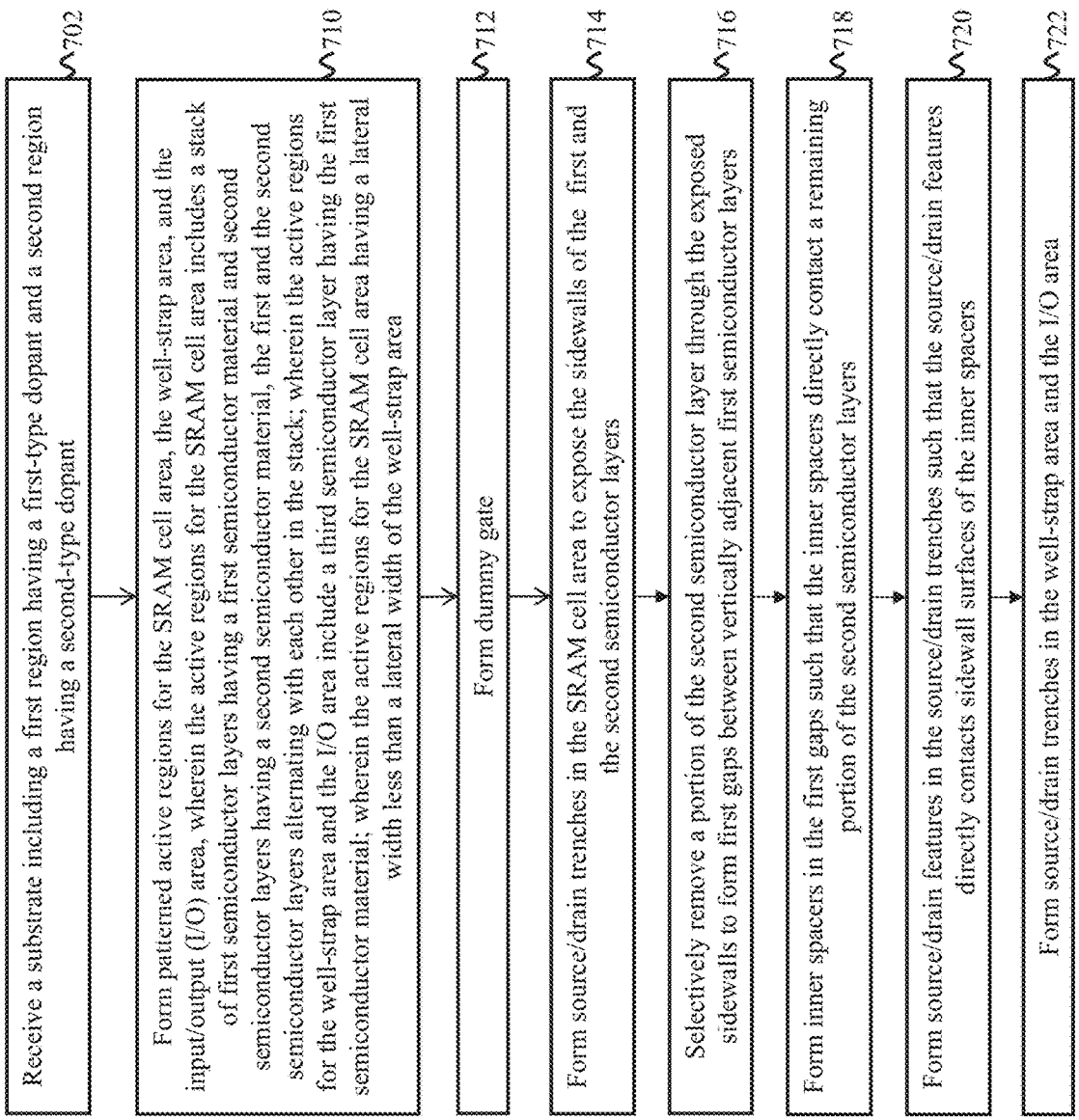
FIGS. 10A and 10B are a flow chart of a method for fabricating an integrated circuit device, according to various aspects of the present disclosure.
Figure 10B:
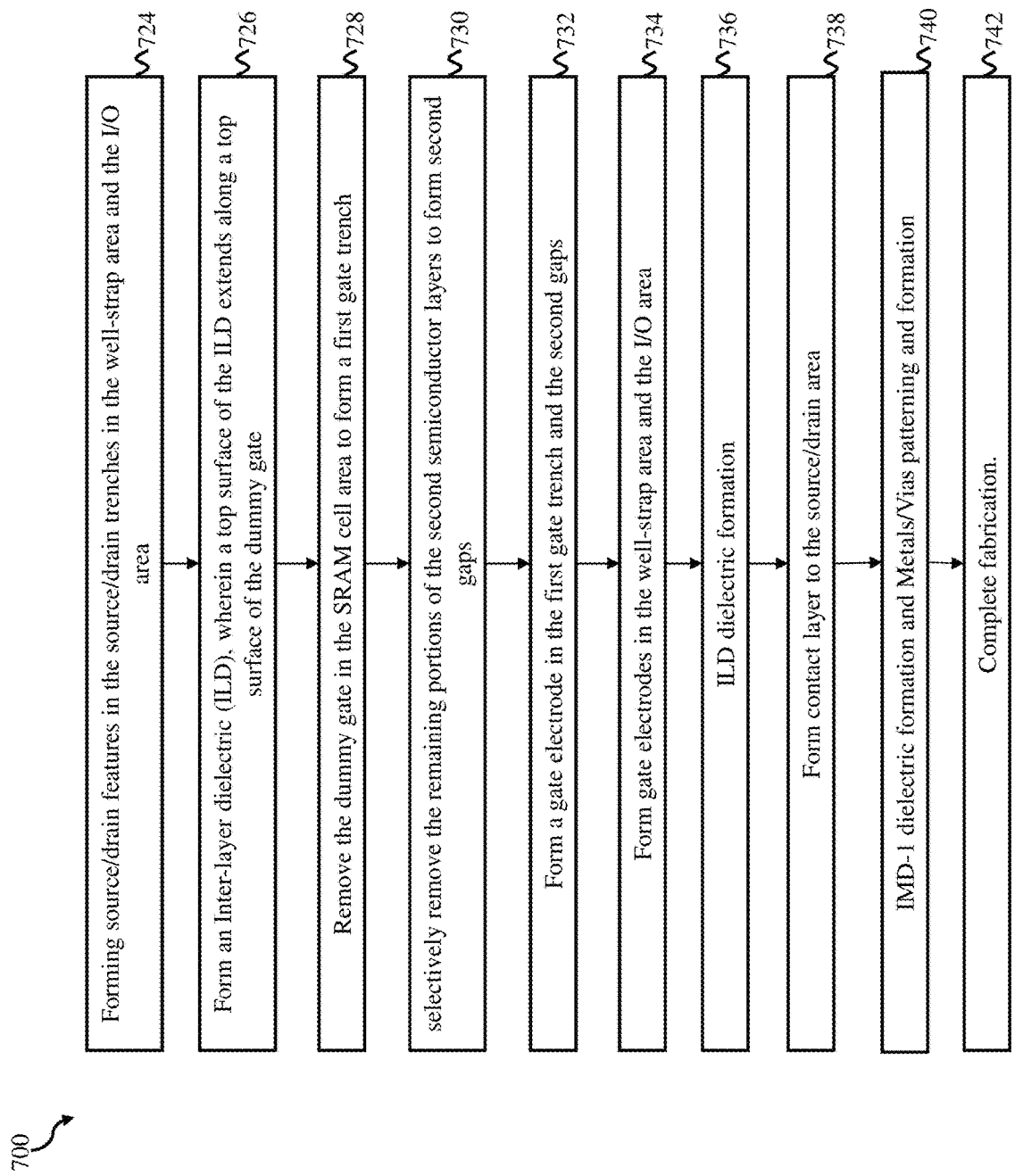

FIG. 10A is a flow chart of a method 700 for fabricating an IC device having channel configurations that optimize performance according to various aspects of the present disclosure. At block 702, method 700 includes receiving a semiconductor substrate. The semiconductor substrate includes a first region having a first-type dopant and a second region having a second-type dopant. At block 710, method 700 includes forming patterned active regions for an SRAM cell area, a well strap area, and an input/output (I/O) area. The active regions for the SRAM cell area includes a stack of first semiconductor layers having a first semiconductor material and second semiconductor layers having a second semiconductor material, where the first and the second semiconductor layers alternate with each other in the stack. The active regions for the well strap area and I/O area include a third semiconductor layer having the first semiconductor material. The active regions for the SRAM cell area have a lateral width less than a lateral width of the well-strap area. At block 712, dummy gates are formed over channel regions of the active regions for the SRAM cell area and over channel regions of the active regions for the well strap area and the I/O area. At block 714, source/drain trenches are formed in the SRAM cell area to expose the sidewalls of the first and the second semiconductor layers in the channel regions of the active regions in the SRAM cell area. At block 716, a portion of the second semiconductor layer is selectively removed through the exposed sidewalls to form first gaps between vertically adjacent first semiconductor layers. At block 718, inner spacers are formed within the first gaps such that the inner spacers directly contact a remaining portion of the second semiconductor layers in the channel regions of the active regions in the SRAM cell area. At block 720, source/drain features are formed in the source/drain trenches, such that the source/drain features directly contact the sidewall surfaces of the inner spacers. At block 722, source/drain trenches are formed in the well strap area and the I/O area. At block 724, source/drain features are formed in the source/drain trenches in the well strap area and the I/O area. At block 726, an inter-layer dielectric (ILD) is formed over the source/drain features and the dummy gates, such that top surfaces of the dummy gates are exposed. At block 728 the dummy gates in the SRAM cell area are removed to form a first gate trenches that expose the channel regions of the active regions in the SRAM cell area. At block 730, the remaining portions of the second semiconductor layers are selectively removed to form second gaps, such that remaining first semiconductor layers form suspended channel layers. At block 732, gate dielectrics and gate electrodes are formed in the first gate trench and the second gaps. At block 734, the dummy gates in the well strap area and the I/O area removed to form second gate trenches that expose the third semiconductor layers in the channel regions of the active regions of the well strap area and the I/O area. Gate dielectrics and gate electrodes are then formed in the second gate trenches in the well strap area and the I/O area, such that the gate dielectrics and gate electrodes wrap the third semiconductor layers in the well strap area and the I/O area. Additional steps can be provided before, during, and after method 700, and some of the steps described can be moved, replaced, or eliminated for additional embodiments of method 700.

Figure 11A:
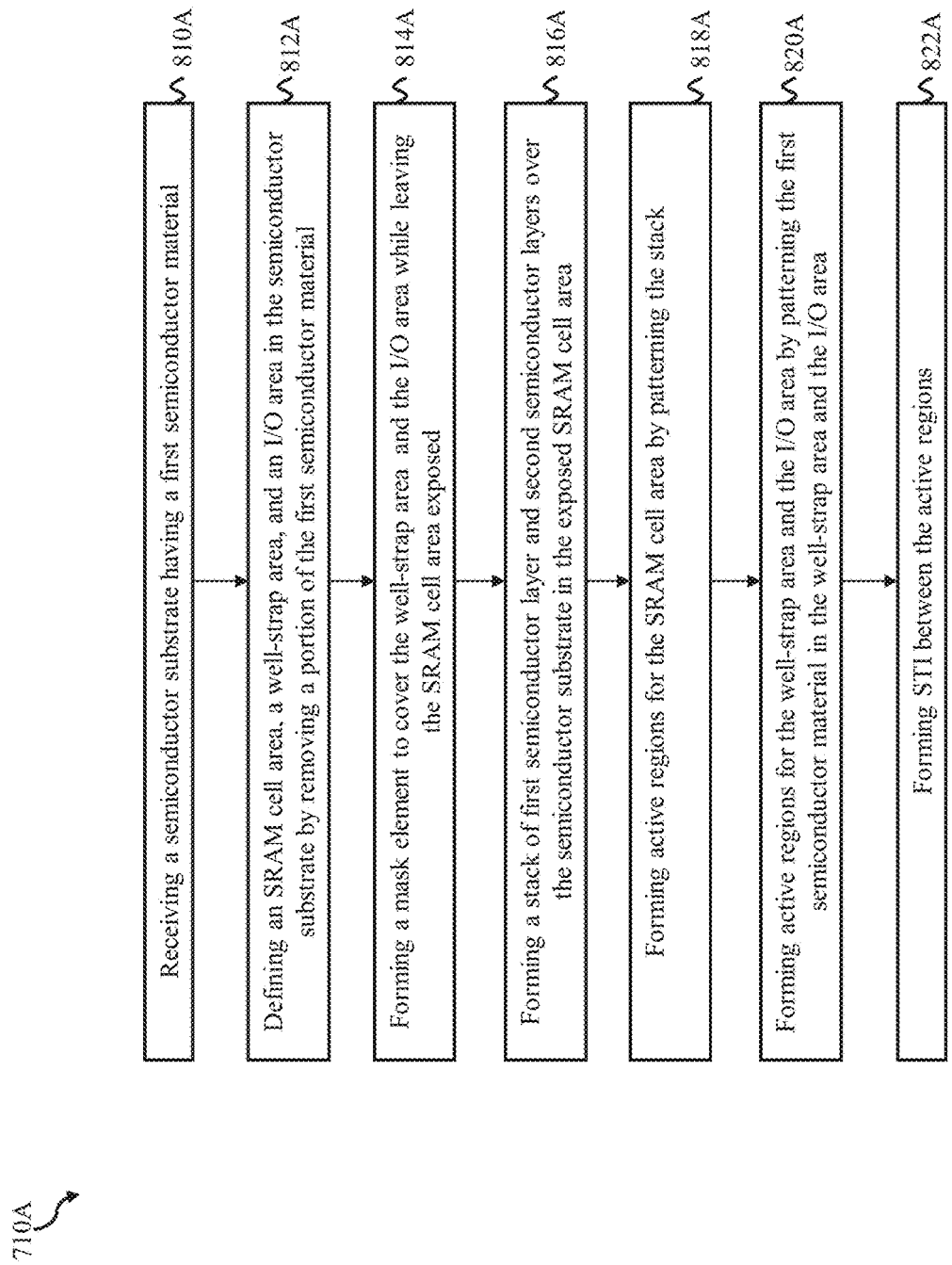
FIGS. 11A and 11B are flow charts illustrating two methods for implementing a step of the method of FIGS. 10A and 10B, according to various aspects of the present disclosure.
Figure 11B:
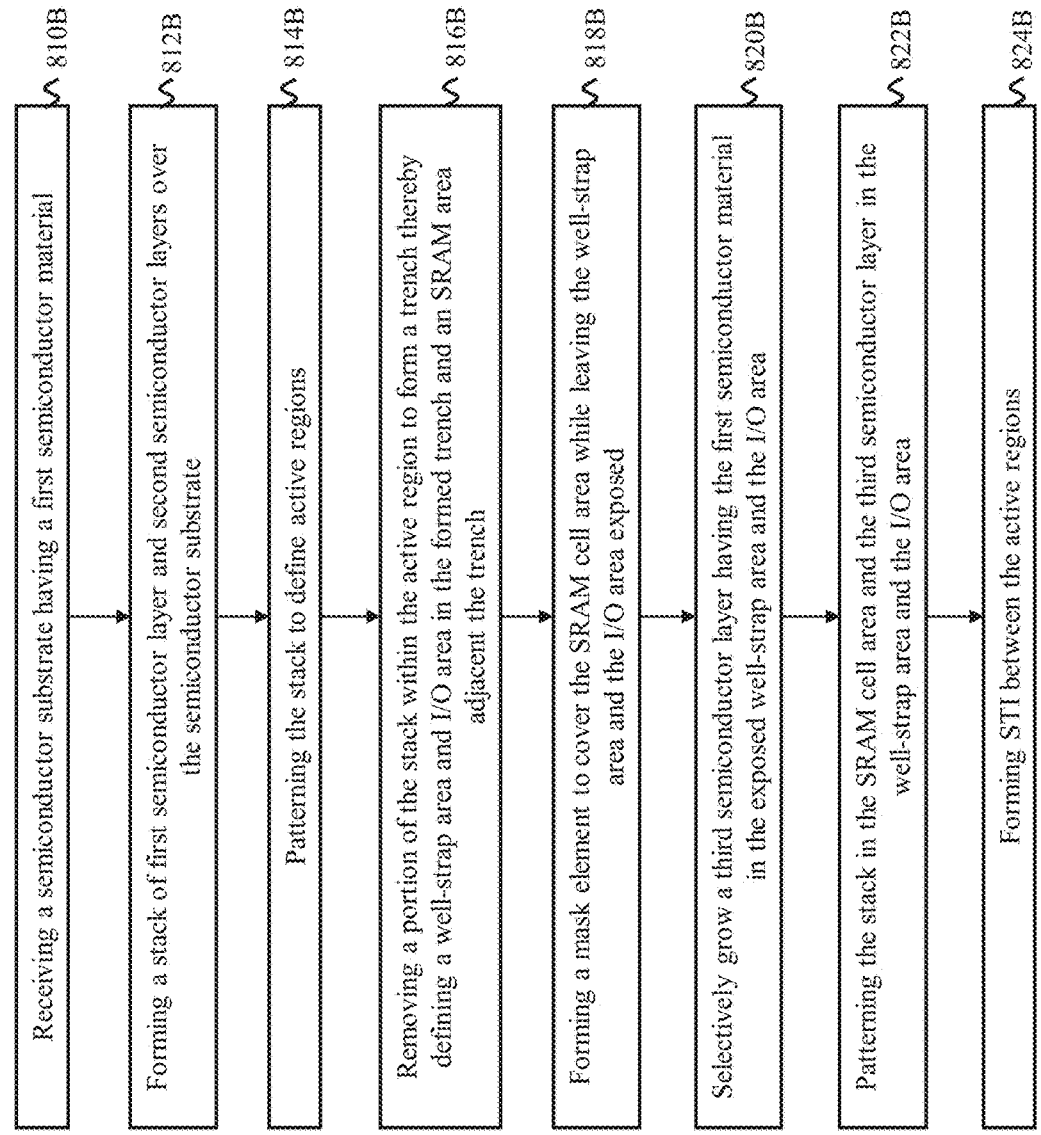

FIGS. 11A and 11B illustrate two methods (or submethods) 710A and 710B that may be used to implement the step of block 710 in FIG. 10A. At block 810A, the method 710A includes receiving a semiconductor substrate having a first semiconductor material. At block 812A, a portion of the first semiconductor material is removed from the substrate. The trench formed in the semiconductor substrate defines an SRAM cell area; and the area adjacent to the trench defines the well strap area and the I/O area. At block 814A, a mask element is formed to cover the well strap area and the I/O area while leaving the SRAM cell area exposed. At block 816A, a stack of first semiconductor layer and second semiconductor layers are formed over the semiconductor substrate in the exposed SRAM cell area. At block 818A, the stack is patterned to form active regions for the SRAM cell area. At block 820A, the first semiconductor material in the well strap area and the I/O area is patterned to form active region for the well strap area and the I/O area. At block 822A, STI is formed between the active regions. Additional steps can be provided before, during, and after method 710A, and some of the steps described can be moved, replaced, or eliminated for additional embodiments of method 710A.

Alternatively, at block 810B, the method 710B includes receiving a semiconductor substrate. At block 812B, a stack of first semiconductor layer and second semiconductor layers are formed over the semiconductor substrate. At block 814B, the stack is patterned to define the active regions. At block 816B, a portion of the stack within the active region is removed to form a trench in the active region thereby defining a well strap area and an I/O area in the formed trench and an SRAM cell area adjacent the trench. At block 818B, a mask element is formed to cover the SRAM cell area while leaving the well strap area and the I/O area exposed. At block 820B, a third semiconductor layer is selectively grown in the exposed well strap area and the I/O area. At block 822B, the stack in the SRAM cell area and the third semiconductor layer in the well strap area and the I/O area are patterned. At block 824B, the STI is formed between the active regions.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Additional steps can be provided before, during, and after method 710B, and some of the steps described can be moved, replaced, or eliminated for additional embodiments of method 710B.

The present disclosure provides for many different embodiments. In one general aspect, a device includes a memory cell and a well strap cell over a substrate. The memory cell includes a gate-all-around (GAA) transistor; and the well strap cell includes a dummy fin-like field effect transistor (FinFET). The GAA transistor includes a first fin extending along a first direction over the substrate, and the dummy FinFET includes a second fin extending along the first direction over the substrate. The GAA transistor includes first source/drain features over the first fin and suspended channel layers between the first source/drain features. The first source/drain features include a first type dopant. The suspended channel layers have a first channel width along a second direction different than the first direction. The dummy FinFET includes second source/drain features over the second fin and a fin channel layer between the second source/drain features. The second source/drain features include a second type dopant. The fin channel layer has a second channel width along the second direction. The second channel width is greater than the first channel width.

In some embodiments, the first channel width is less than the second channel width by at least about 5 nm. In some embodiments, the device further includes a gate structure extending along the second direction and engaging with the suspended channel layers. In some embodiments, the memory cell includes a first gate portion adjacent to a second gate portion, the second gate portion adjacent to a third gate portion. The first gate portion has a first gate material. The second gate portion has a second gate material. And the third gate portion has the first gate material. The first, second, and third gate portions each extends lengthwise along the second direction. The first gate portion wraps and engages the suspended channel layers. The well strap cell includes a fourth gate portion adjacent to a fifth gate portion, the fifth gate portion adjacent to a sixth gate portion. The fourth gate portion has the first gate material. The fifth gate portion has the second gate material. And the sixth gate portion has the first gate material. The fourth, fifth, and sixth gate portions each extends lengthwise along the second direction. The fourth gate portion wraps and engages the fin channel layer. A first dielectric layer extends between the second gate portion and the third gate portion; and a second dielectric layer extends between the fifth gate portion and the sixth gate portion. In some embodiments, the suspended channel layers have a first channel thickness along a third direction. The third direction is perpendicular to the first direction and the second direction. The fin channel layer has a second channel thickness along the third direction. A ratio of the second channel thickness to the first channel thickness is about 5 to about 20. In some embodiments, the dummy FinFET is a first dummy FinFET, and the fin channel layer is a first fin channel layer. The substrate includes a first doped region of the second type dopant, a second doped region of the second type dopant, and a third doped region of the first type dopant. The third doped region is disposed between the first doped region and the second doped region. The GAA transistor and the first dummy FinFET are disposed over the first doped region. The well strap cell further includes a second dummy FinFET disposed over the third doped region. The second dummy FinFET includes a second fin channel layer and third source/drain features of the first type dopant. The second fin channel layer is disposed between the third source/drain features and has a third channel width along the second direction. The third channel width is greater than the first channel width. The first dummy FinFET connects the first doped region to a first voltage and the second dummy FinFET connects the third doped region to a second voltage. In some embodiments, the GAA transistor is a first GAA transistor, and the suspended channel layers are first suspended channel layers. The memory cell further includes a second GAA transistor disposed over the third doped region. The second GAA transistor includes a second suspended channel layer and fourth source/drain features of the second type dopant. The second suspended channel layer extend along the first direction and are disposed between the fourth source/drain features. The second suspended channel layer has a fourth channel width along the second direction. The third channel width is greater than the fourth channel width. In some embodiments, the well strap cell includes a third dummy FinFET disposed over the second doped region. The third dummy FinFET includes a third fin channel layer and fifth source/drain features of the second type dopant. The third fin channel layer is disposed between the fifth source/drain features. Moreover, the third fin channel layer has a fifth channel width along the second direction. The fifth channel width is greater than the first channel width. The third dummy FinFET connects the second doped region to the first voltage. In some embodiments, the fifth channel width and the second channel width are substantially the same. In some embodiments, the well strap cell is a first well strap cell, and the device further includes a second well strap cell adjacent to the first well strap cell. The fin channel layer overlaps a boundary between the first well strap cell and the second well strap cell. In some embodiments, the second channel width is about 50 nm to about 200 nm.

In one general aspect, a device includes a memory cell over a substrate. The memory cell has a first gate-all-around (GAA) transistor of a first transistor type, a second GAA transistor of a second transistor type, and a third GAA transistor of the first transistor type. The first GAA transistor has a first suspended channel layer with a first channel width. The second GAA transistor has a second suspended channel layer with a second channel width. And the third GAA transistor has a third suspended channel layer with the first channel width. The device also includes a well strap cell over the substrate. The well strap cell has a first dummy fin-like field effect transistor (FinFET) of the second transistor type and a second dummy FinFET of the first transistor type. The first dummy FinFET has a first fin channel layer with a third channel width. The second dummy FinFET has a second fin channel layer with a fourth channel width. The third channel width is greater than the first channel width and the fourth channel width is greater than the second channel width.

In some embodiments, the well strap cell further includes a third dummy FinFET of the second transistor type. The third dummy FinFET has a third fin channel layer with the third channel width. The first GAA transistor and the first dummy FinFET are formed in a first region. The second GAA transistor and the second dummy FinFET are formed in a second region. And the third GAA transistor and the third dummy FinFET are formed in a third region. The second region includes a first type dopant; the first region includes a second type dopant, and the third regions includes the second type dopant. A source/drain feature of the first GAA transistor includes the first type dopant; a source/drain feature of the second GAA transistor includes the second type dopant; and a source/drain feature of the third GAA transistor includes the first type dopant. Moreover, a source/drain feature of the first dummy FinFET includes the second type dopant; a source/drain feature of the second dummy FinFET includes the first type dopant; and a source/drain feature of the third dummy FinFET includes the second type dopant. The first dummy FinFET connects the first region to a first voltage; the second dummy FinFET connects the second region to a second voltage; and the third dummy FinFET connects the third region to the first voltage. In some embodiments, the third channel width is greater than about 15 nm; and the fourth channel width is greater than about 10 nm. In some embodiments, the first channel width is greater than the second channel width. In some embodiments, the well strap cell has a cell boundary line. The first dummy FinFET overlaps a first portion of the cell boundary line. And the second dummy FinFET overlaps a second portion of the cell boundary line spaced away from the first portion of the cell boundary line. In some embodiments, the memory cell includes a first gate portion adjacent to a second gate portion, the second gate portion adjacent to a third gate portion. The first gate portion has a first gate material; the second gate portion has a second gate material, and the third gate portion has the first gate material. The first gate portion wraps and engages the first suspended channel layer; the second gate portion wraps and engages the second suspended channel layer; and the third gate portion wraps and engages the third suspended channel layer. The well strap cell includes a fourth gate portion adjacent to a fifth gate portion, the fifth gate portion adjacent to a sixth gate portion. The fourth gate portion has the first gate material; the fifth gate portion has the second gate material, and the sixth gate portion has the first gate material. The fourth gate portion wraps and engages the first fin channel layer. A first dielectric layer extends between the second gate portion and the third gate portion; and a second dielectric layer extends between the fifth gate portion and the sixth gate portion.

In one general aspect, the present disclosure provides a method. A substrate is received. A first fin, a second fin, a third fin, and a fourth fin are formed over the substrate. The first fin, second fin, third fin, and fourth fin each extends lengthwise along a first direction. A first gate-all-around (GAA) transistor is formed from the first fin. A first dummy fin-like field effect transistor (FinFET) is formed from the second fin. A second GAA transistor is formed from the third fin. And a second dummy FinFET is formed from the fourth fin. The first GAA transistor is of a first transistor type. The first dummy FinFET is of a second transistor type. The second GAA transistor is of the second transistor type. And the second dummy FinFET is of the first transistor type. The first GAA transistor includes a first suspended channel layer. The first suspended channel layer has a first channel width along a second direction that is substantially perpendicular to the first direction. The first suspended channel layer further has a first channel thickness along a third direction that is substantially perpendicular to a plane defined by the first direction and the second direction. The second GAA transistor includes a second suspended channel layer. The second suspended channel layer has a second channel width along the second direction. The second suspended channel layer further has a second channel thickness along the third direction. The first dummy FinFET includes a first fin channel that has a third channel width along the second direction and a third channel thickness along the third direction. The third channel width is greater than the first channel width; and the third channel thickness is greater than the first channel thickness. The second dummy FinFET includes a second fin channel that has a fourth channel width along the second direction and a fourth channel thickness along the third direction. The fourth channel width is greater than the second channel width; and the fourth channel thickness is greater than the second channel thickness. A first interlayer dielectric (ILD) is formed. A first contact feature is formed to connect the first dummy FinFET to a first voltage; and a second contact feature is formed to connect the second dummy FinFET to a second voltage.

In some embodiments, the substrate includes a first region of a first type dopant and a second region of a second type dopant. The first GAA transistor and the first dummy FinFET are formed in the first region, and the second GAA and the second dummy FinFET are formed in the second region. Moreover, a first portion of the substrate is etched to form a trench. The first portion spans across the first region and the second region. Furthermore, a stack of first semiconductor layers and second semiconductor layers is formed in the trench. The first semiconductor layers and the second semiconductor layers alternate with each other within the stack. The first semiconductor layers has a first semiconductor material and the second semiconductor layers having a second semiconductor material that is different than the first semiconductor material. The forming of the first GAA transistor, the second GAA transistor, the first dummy FinFET, and the second dummy FinFET includes forming the first GAA transistor and the second GAA transistor from a portion of the stack, and forming the first dummy FinFET and the second dummy FinFET in a second portion of the substrate adjacent to the first portion of the substrate. The second portion spans across the first region and the second region. In some embodiments, a stack of first semiconductor layers and second semiconductor layers are formed over the substrate. The first semiconductor layers and the second semiconductors alternate with each other within the stack. The first semiconductor layers have a first semiconductor material and the second semiconductor layers having a second semiconductor material that is different than the first semiconductor material. The stack spans a first region with a first type dopant and a second region with a second type dopant. A first portion of the stack is etched to form a trench. A third semiconductor layer is formed in the trench. The third semiconductor layer includes the first semiconductor material. Moreover, the forming of the first GAA transistor, the second GAA transistor, the first dummy FinFET, and the second dummy FinFET includes patterning the stack to form a first active region and a second active region. The first active region corresponds with the first GAA transistor and the second active region corresponds with the second GAA transistor. The forming of the first GAA transistor, the second GAA transistor, the first dummy FinFET, and the second dummy FinFET further includes patterning the third semiconductor layer to form a third active region that corresponds with the first dummy FinFET and a fourth active region the corresponds with the second dummy FinFET.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
  a memory cell and a well strap cell over a substrate, the memory cell including a Gate-All-Around (GAA) transistor and the well strap cell including a dummy fin-like field effect transistor (FinFET),
  wherein the GAA transistor includes a first fin extending along a first direction over the substrate and the dummy FinFET includes a second fin extending along the first direction over the substrate,
  wherein the GAA transistor includes first source/drain features over the first fin and suspended channel layers between the first source/drain features, the first source/drain features including a first type dopant and the suspended channel layers having a first channel width along a second direction different than the first direction,
  wherein the dummy FinFET includes second source/drain features over the second fin and a fin channel layer between the second source/drain features, the second source/drain features including a second type dopant and the fin channel layer having a second channel width along the second direction, and
  wherein the second channel width is greater than the first channel width.

2. The device of claim 1, wherein the first channel width is less than the second channel width by at least about 5 nm.

3. The device of claim 1, wherein the device further comprises a gate structure extending along the second direction and engaging with the suspended channel layers.

4. The device of claim 1, wherein:
  the memory cell includes a first gate portion having a first gate material adjacent to a second gate portion having a second gate material, the second gate portion adjacent to a third gate portion having the first gate material, the first, second, and third gate portions each extending lengthwise along the second direction, and the first gate portion wrapping and engaging the suspended channel layers;
  the well strap cell includes a fourth gate portion having the first gate material adjacent to a fifth gate portion having the second gate material, the fifth gate portion adjacent to a sixth gate portion having the first gate material, the fourth, fifth, and sixth gate portions each extending lengthwise along the second direction, and the fourth gate portion wrapping and engaging the fin channel layer;
  a first dielectric layer extends between the second gate portion and the third gate portion; and
  a second dielectric layer extends between the fifth gate portion and the sixth gate portion.

5. The device of claim 1, wherein:
  the suspended channel layers have a first channel thickness along a third direction that is perpendicular to the first direction and the second direction;
  the fin channel layer has a second channel thickness along the third direction; and
  a ratio of the second channel thickness to the first channel thickness is about 5 to about 20.

6. The device of claim 1, wherein:
  the dummy FinFET is a first dummy FinFET,
  the fin channel layer is a first fin channel layer,
  the substrate includes a first doped region of the second type dopant, a second doped region of the second type dopant, and a third doped region of the first type dopant disposed between the first doped region and the second doped region,
  the GAA transistor and the first dummy FinFET are disposed over the first doped region,
  the well strap cell further includes a second dummy FinFET disposed over the third doped region, the second dummy FinFET including a second fin channel layer and third source/drain features of the first type dopant, wherein the second fin channel layer is disposed between the third source/drain features and has a third channel width along the second direction,
  the third channel width is greater than the first channel width, and
  the first dummy FinFET connects the first doped region to a first voltage and the second dummy FinFET connects the third doped region to a second voltage.

7. The device of claim 6, wherein:
  the GAA transistor is a first GAA transistor, and the suspended channel layers are first suspended channel layers;
  the memory cell further includes a second GAA transistor disposed over the third doped region, wherein the second GAA transistor includes second suspended channel layers extending along the first direction and fourth source/drain features of the second type dopant, wherein the second suspended channel layers are disposed between the fourth source/drain features and has a fourth channel width along the second direction; and the third channel width is greater than the fourth channel width.

8. The device of claim 6, wherein:
the well strap cell includes a third dummy FinFET disposed over the second doped region, the third dummy FinFET including a third fin channel layer and fifth source/drain features of the second type dopant;
wherein the third fin channel layer is disposed between the fifth source/drain features and has a fifth channel width along the second direction; and
wherein the fifth channel width is greater than the first channel width and the third dummy FinFET connects the second doped region to the first voltage.

9. The device of claim 8, wherein the fifth channel width and the second channel width are substantially the same.

10. The device of claim 1, wherein the well strap cell is a first well strap cell, the device further comprising a second well strap cell adjacent to the first well strap cell, wherein:
the fin channel layer overlaps a boundary between the first well strap cell and the second well strap cell.

11. The device of claim 1, wherein the second channel width is about 50 nm to about 200 nm.

12. A device comprising:
a memory cell over a substrate and having a first Gate-All-Around (GAA) transistor of a first transistor type, a second GAA transistor of a second transistor type, and a third GAA transistor of the first transistor type, the first GAA transistor having a first suspended channel layer with a first channel width, the second GAA transistor having a second suspended channel layer with a second channel width, and the third GAA transistor having a third suspended channel layer with the first channel width;
a well strap cell over the substrate and having a first dummy fin-like field effect transistor (FinFET) of the second transistor type and a second dummy FinFET of the first transistor type, wherein the first dummy FinFET has a first fin channel layer with a third channel width and the second dummy FinFET has a second fin channel layer with a fourth channel width; and
wherein the third channel width is greater than the first channel width and the fourth channel width is greater than the second channel width.

13. The device of claim 12, wherein the well strap cell further includes a third dummy FinFET of the second transistor type, the third dummy FinFET having a third fin channel layer with the third channel width, and
wherein the first GAA transistor and the first dummy FinFET are formed in a first region, the second GAA transistor and the second dummy FinFET are formed in a second region, and the third GAA transistor and the third dummy FinFET are formed in a third region, the second region includes a first type dopant, the first region includes a second type dopant, and the third region includes the second type dopant,
wherein a source/drain feature of the first GAA transistor includes the first type dopant, a source/drain feature of the second GAA transistor includes the second type dopant, a source/drain feature of the third GAA transistor includes the first type dopant, a source/drain feature of the first dummy FinFET includes the second type dopant, a source/drain feature of the second dummy FinFET includes the first type dopant, and a source/drain feature of the third dummy FinFET includes the second type dopant, and
wherein the first dummy FinFET connects the first region to a first voltage, the second dummy FinFET connects the second region to a second voltage, and the third dummy FinFET connects the third region to the first voltage.

14. The device of claim 13, wherein:
the third channel width is greater than about 15 nm; and
the fourth channel width is greater than about 10 nm.

15. The device of claim 12, wherein the first channel width is greater than the second channel width.

16. The device of claim 12, wherein:
the well strap cell has a cell boundary line;
the first dummy FinFET overlaps a first portion of the cell boundary line; and
the second dummy FinFET overlaps a second portion of the cell boundary line spaced away from the first portion of the cell boundary line.

17. The device of claim 12, wherein:
the memory cell includes a first gate portion having a first gate material adjacent to a second gate portion having a second gate material, the second gate portion adjacent to a third gate portion having the first gate material;
the first gate portion wraps and engages the first suspended channel layer;
the second gate portion wraps and engages the second suspended channel layer;
the third gate portion wraps and engages the third suspended channel layer;
the well strap cell includes a fourth gate portion having the first gate material adjacent to a fifth gate portion having the second gate material, the fifth gate portion adjacent to a sixth gate portion having the first gate material;
the fourth gate portion wraps and engages the first fin channel layer;
a first dielectric layer extends between the second gate portion and the third gate portion; and
a second dielectric layer extends between the fifth gate portion and the sixth gate portion.

18. A device, comprising:
a semiconductor substrate;
a first Gate-All-Around (GAA) transistor of a first transistor type over the semiconductor substrate, the first GAA including a first suspended channel layer having a first channel width along a first direction and a first channel thickness along a second direction substantially perpendicular to the first direction;
a second GAA transistor of a second transistor type over the semiconductor substrate, the second GAA transistor including a second suspended channel layer having a second channel width along the first direction and a second channel thickness along the second direction;
a first dummy fin-like field effect transistor (FinFET) of the second transistor type over the semiconductor substrate, the first dummy FinFET including a first fin channel having a third channel width along the first direction greater than the first channel width and a third channel thickness along the second direction greater than the first channel thickness;
a second dummy FinFET of the first transistor type over the semiconductor substrate, the second dummy FinFET including a second fin channel having a fourth channel width along the first direction greater than the second channel width and a fourth channel thickness along the second direction greater than the second channel thickness;

a first contact feature connecting the first dummy FinFET to a first voltage; and a second contact feature connecting the second dummy FinFET to a second voltage.

19. The device of claim 18, wherein a difference between the first channel width and the third channel width is at least about 5 nm.

20. The device of claim 18, wherein a ratio of the third channel thickness to the first channel thickness is about 5 to about 20.

* * * * *